United States Patent
Yan et al.

(10) Patent No.: US 8,137,998 B2
(45) Date of Patent: Mar. 20, 2012

(54) METHOD FOR FABRICATING LIGHT-EMITTING DEVICES WITH VERTICAL LIGHT-EXTRACTION MECHANISM

(75) Inventors: Chunhui Yan, El Monte, CA (US); Jianping Zhang, El Monte, CA (US)

(73) Assignee: Invenlux Limited, Central (HK)

( * ) Notice: Subject to any disclaimer, the term of this patent is extended or adjusted under 35 U.S.C. 154(b) by 89 days.

(21) Appl. No.: 12/860,698

(22) Filed: Aug. 20, 2010

(65) Prior Publication Data

US 2011/0256651 A1  Oct. 20, 2011

Related U.S. Application Data

(63) Continuation of application No. 12/761,708, filed on Apr. 16, 2010.

(51) Int. Cl.
*H01L 21/00* (2006.01)

(52) U.S. Cl. ............... 438/22; 438/24; 438/39; 257/79; 257/94; 257/99; 257/103; 257/E33.068

(58) Field of Classification Search ............... None
See application file for complete search history.

(56) References Cited

U.S. PATENT DOCUMENTS

| | | | | |
|---|---|---|---|---|
| 6,121,121 | A * | 9/2000 | Koide | 438/481 |
| 7,053,420 | B2 * | 5/2006 | Tadatomo et al. | 257/98 |
| 7,488,988 | B2 * | 2/2009 | Lin et al. | 257/94 |
| 7,781,790 | B2 * | 8/2010 | Minato et al. | 257/98 |
| 2005/0179130 | A1 * | 8/2005 | Tanaka et al. | 257/730 |
| 2010/0051977 | A1 * | 3/2010 | Kim et al. | 257/93 |

FOREIGN PATENT DOCUMENTS

JP   02008244302 A * 10/2008

* cited by examiner

*Primary Examiner* — Zandra Smith
*Assistant Examiner* — Khanh Duong
(74) *Attorney, Agent, or Firm* — J.C. Patents

(57) ABSTRACT

A light-emitting device comprises a lattice structure to minimize the horizontal waveguide effect by reducing light traveling distance in the light-absorption medium of the light-emitting devices, and to enhance light extraction from the light-emitting layer. The lattice structure includes sidewalls and/or rods embedded in the light-absorption medium and dividing the light-absorption medium into a plurality of area units. The area units are completely isolated or partially separated from each other by the sidewalls. Also provided is a method of fabricating a light-emitting device that comprises a lattice structure, which lattice structure includes sidewalls and/or rods embedded in the light-absorption medium and dividing the light-absorption medium into a plurality of area units.

11 Claims, 20 Drawing Sheets

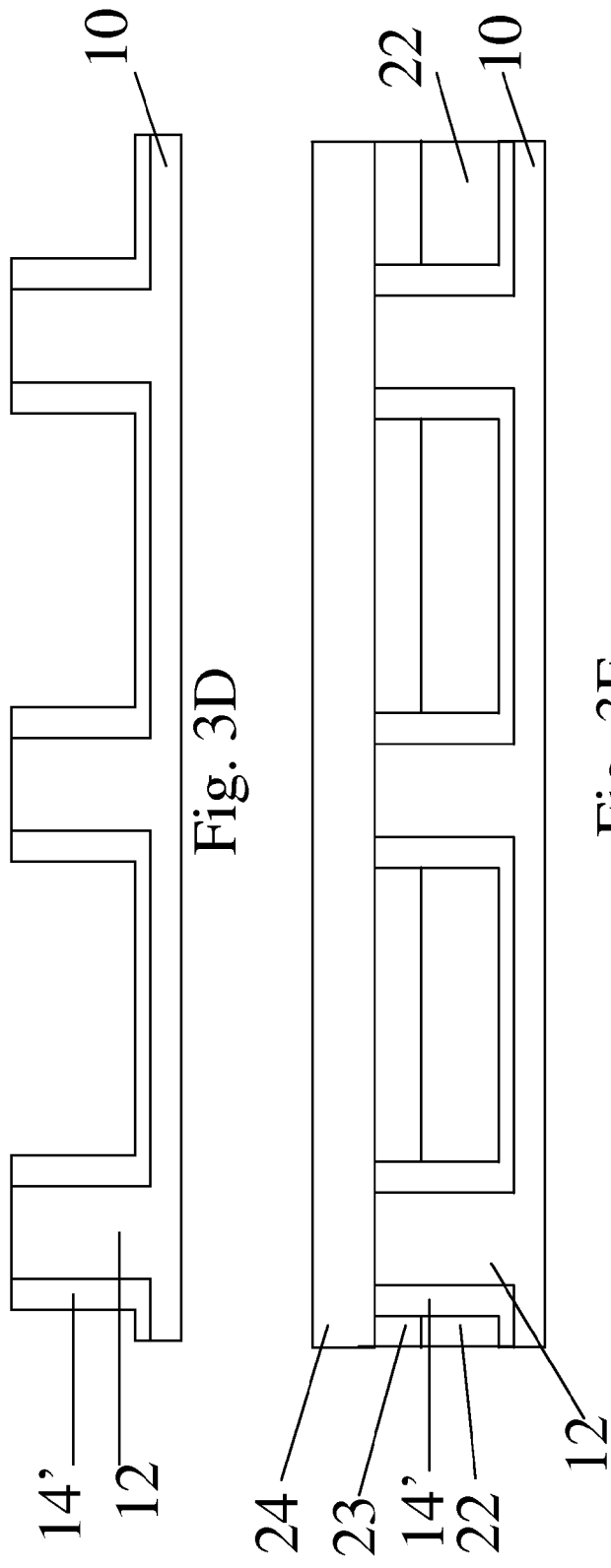
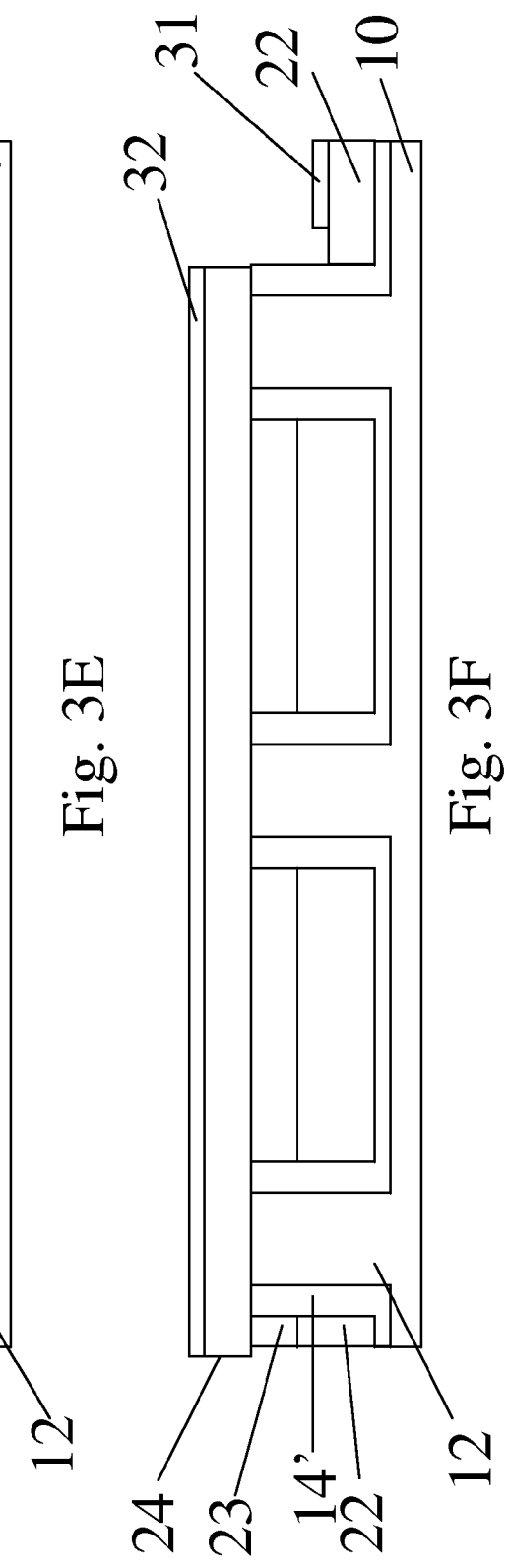

12'

METHOD FOR FABRICATING LIGHT-EMITTING DEVICES WITH VERTICAL LIGHT-EXTRACTION MECHANISM

CROSS-REFERENCE TO RELATED APPLICATIONS

This application is a continuation of application Ser. No. 12/761,708 filed on Apr. 16, 2010, the content of which is hereby incorporated by reference in its entirety.

FIELD OF THE INVENTION

The present invention relates in general to light-emitting devices, and more particularly to light-emitting devices with reduced self-absorption and enhanced light extraction, and to a method for fabricating the same.

DESCRIPTION OF THE RELATED ART

From light-extraction point of view, light traveling in media constantly undergoes loss due to the following mechanisms:
1) Interface loss because of refractive index mismatch and existence of evanescent wave along the interface.
2) Total internal reflection. When a ray of light is incident from an optically denser medium to a less dense medium, a total internal reflection takes place at the interface if the angle of incidence is over a critical angle. Suppose the optically denser medium has a refractive index $n_2$, and the less dense one has a refractive index $n_1$, the critical angle, $\theta_c$, is define by the relationship: $\sin \theta_c = n_1/n_2$. Because of the total internal reflection, light can only escape from the optically denser medium to the less dense medium within a light escape cone (a cone with a solid angle of $2\pi(1-\cos \theta_c)$). The light escape percentage equals to $(1-\cos \theta_c)/2$, or approximately to $\theta_c^2/4$, or more conveniently approximately equal to $(n_1/n_2)^2/4$. Here approximation is made when $\theta_c$ is small.
3) Absorption of medium. If medium possesses nonvanishing absorption coefficient, $\alpha$, light intensity decays exponentially with travelling distance t within the medium, $\exp(-\alpha t)$.

In recent years, solid-state light sources, such as light-emitting diodes (LEDs), are increasingly challenging traditional light sources such as incandescent lamps or fluorescent lamps, due to their technological and economical advantages. Currently, high efficient LED white light lamps with efficacy over 100 lm/watt are commercially available from several independent vendors. Unlike traditional light sources, solid-state light sources generate light in a solid-state material, which usually possesses a refractive index, n, above 2, much larger than that of air or free space (n equal to 1). For example, for GaN-based visible LEDs, the light-emitting medium, InGaN, has a refractive index above 2.46 depending on the indium composition. This means that only a small portion of light generated within InGaN can escape from the optically denser medium. From the abovementioned loss mechanism 2), for a thin-film GaN-based visible LED, light has two escape cones. This translates into a total escaped light portion being only about 8% of the total generated light within the InGaN medium. In view of this poor light extraction efficiency limited by total internal reflection, methods like surface roughening (e.g. U.S. Pat. Nos. 7,422,962, 7,355,210, aiming at reducing total internal reflection), LED chip sidewall shaping (e.g. U.S. Pat. No. 7,652,299, aiming at increase light escape cones), and photonic crystal incorporation (e.g. U.S. Pat. Nos. 5,955,749, 7,166,870, 7,615,398, 7,173,289, 7,642,108, 7,652,295, 7,250,635, aiming at enhancing spontaneous light generation rate and light extraction for specific wavelengths) were introduced in the prior art.

So far, light loss due to total internal reflection in LEDs has been partly taken care of in the prior art. However, light loss due to self-absorption has hardly been addressed. For nitride based LEDs or any other LEDs heteroeptaxially deposited on foreign substrates, the mismatch of refractive index between the substrate and the epilayers introduces a horizontal waveguide mechanism. This confines part (visible light) or most (deep UV light) of the generated light traveling horizontally in the epilayers. Since the epilayers forming the LED structure posses finite or even very strong absorption coefficient, this horizontally waveguide effect essentially results in large light loss. In the literature, GaN and InGaN were reportedly to have an absorption coefficient of 300 $cm^{-1}$ and $10^5$ $cm^{-1}$ for visible light, respectively. These numbers mean that for blue-green visible light traveling in GaN, the light loss due to GaN absorption reaches 14% per 5 μm distance. For blue-green visible light traveling in the active-region InGaN quantum wells, the light loss due to InGaN self-absorption reaches 10% per 10 nm distance. This kind of huge loss due to self-absorption means that there is a high need to get out of the light from the light-emitting medium as soon as possible.

SUMMARY OF THE INVENTION

Accordingly, the present invention proposes a solution to solve the abovementioned self-absorption within solid-state light-emitting devices. A mechanism is introduced to interrupt, or block the horizontal waveguide effect by reducing light traveling distance in absorption media of the light-emitting devices, and facilitate or enhance light extraction through the shortest path, which is most likely perpendicular to the light emitting layer, or in the vertical direction. This invention involves introducing vertical light-guiding grid and/or rods, forming a lattice structure vertically embedded in light-generation medium. The lattice structure, in the form of grid or rod lattice, extracts light and guide the extracted light, through the shortest path (substantially perpendicular to the light-emitting layer), out of the light-emitting medium to free space for different applications. As the lattice structure significantly reduces the distance traveled by light in the light-generation medium, the present invention greatly reduces light self-absorption by the light-generation medium, and in the meantime, also effectively reduces light loss due to total internal reflection.

One aspect of the present invention provides a light-emitting device, which comprises: a substrate with a lattice structure integral with the substrate and extending upward from an upper surface of the substrate; a n-type layer formed over the substrate; a light-emitting layer formed over the n-type layer; and a p-type layer formed over the light-emitting layer; wherein the lattice structure penetrates the n-type layer and the light-emitting layer.

Preferably, the lattice structure comprises a plurality of rods which penetrate the n-type layer and the light-emitting layer, and extend up to or into the p-type layer.

Preferably, the lattice structure comprises sheet-shaped sidewalls which penetrate the n-type layer and the light-emitting layer, and extend up to or into the p-type layer, and divide the n-type layer and the light-emitting layer into a plurality of area units.

The lattice structure may have a grading refractive index which decreases in the direction from the light-emitting layer to the p-type layer.

A coating can be formed on the lattice structure, separating the lattice structure from the n-type layer and the light-emitting layer.

There can be a gap formed between the lattice structure and the n-type layer and the light-emitting layer.

Another aspect of the present invention provides a light-emitting device, which comprises: a n-type layer; a p-type layer; an light-emitting layer sandwiched between the n-type layer and the p-type layer; and a lattice structure comprising sheet-shaped sidewalls which penetrate the light-emitting layer and divide the light-emitting layer into a plurality of area units.

The area units can be completely isolated from each other by the sheet-shaped sidewalls of the lattice structure. Preferably, the lattice structure also penetrates the n-type layer and divides the n-type layer into a plurality of area units. A conductive layer can be deposited adjacent to the n-type layer and being in electrical connection with each of the area units of the n-type layer.

The area units can be partially separated from to each other, and an enclosure degree of the area units can be equal to or higher than 20%.

The light-emitting device can further comprise another n-type layer formed adjacent to one side of the n-type layer opposite to the light-emitting layer, and another lattice structure can be embedded in the another n-type layer, so that the two lattice structures are positioned in different layers. The another lattice structure may comprise sheet-shaped sidewalls which are vertically embedded in the another n-type layer. The another lattice structure may comprise a plurality of rods which are vertically embedded in the another n-type layer.

Another aspect of the present invention provides a light-emitting device, which comprises: a substrate with a first lattice structure integral with the substrate and extending upward from an upper surface of the substrate; a first n-type layer formed over the substrate; a second n-type layer formed over the substrate; a light-emitting layer formed over the n-type layer; a p-type layer formed over the light-emitting layer; and a second lattice structure vertically spaced from the first lattice structure; wherein the first lattice structure is embedded in the first n-type layer and the second lattice structure penetrates the second n-type layer and the light-emitting layer.

Preferably, the first lattice structure comprises sheet-shaped sidewalls or a plurality of rods which are vertically embedded in the first n-type layer.

Preferably, the second lattice structure comprises a plurality of rods which penetrate the second n-type layer and the light-emitting layer, and extend up to or into the p-type layer, Preferably, the second lattice structure comprises sheet-shaped sidewalls which penetrate the second n-type layer and the light-emitting layer, and extend up to or into the p-type layer, and divide the second n-type layer and the light-emitting layer into a plurality of area units.

Another aspect of the present invention provides a method for fabricating a light-emitting device. The method comprises: patterning a substrate to form a lattice structure extending upward from the substrate; forming a n-type layer over the substrate so that the lattice structure penetrates the n-type layer; forming a light-emitting layer over the n-type layer so that the lattice structure penetrates the light-emitting layer; and forming a p-type layer over the light-emitting layer so that the lattice structure extends up to the p-type layer or into the p-type layer.

The method may further comprise forming a coating on the lattice structure before forming the n-type layer, the light-emitting layer, and the p-type layer. The coating can be formed via epitaxial growth and etching back, or via sputtering, or via oxidation. The method may further comprise removing the coating after forming the n-type layer and the light-emitting layer, so that a gap is formed between the lattice structure and the n-type layer and the light-emitting layer.

Another aspect of the present invention provides a method for fabricating a light-emitting device. The method comprises: forming a material layer over a substrate; patterning and etching the material layer to form a lattice structure from the material layer, wherein the lattice structure extends upward from the substrate; forming a n-type layer over the substrate so that the lattice structure penetrates the n-type layer; forming an light-emitting layer over the n-type layer so that the lattice structure penetrates the light-emitting layer; and forming a p-type layer over the light-emitting layer so that the lattice structure extends up to or into the p-type layer.

The material layer can be single layer or comprise multiple layers of different refractive index. The material layer may have a varying refractive index in a direction perpendicular to the substrate.

The method may further comprise forming a conductive layer between the material layer and the substrate before patterning and etching the material layer, wherein the step of patterning and etching the material layer also etches into a top portion of the conductive layer.

Another aspect of the present invention provides a method for fabricating a light-emitting device. The method comprises: patterning a substrate to form a first lattice structure extending upward from the substrate; forming a first n-type layer over the substrate so that the lattice structure is embedded in the first n-type layer; forming a material layer over the first n-type layer; patterning and etching the material layer to form a second lattice structure from the material layer; forming a second n-type layer over the first n-type layer so that the second lattice structure penetrates the second n-type layer; forming a light-emitting layer over the second n-type layer so that the second lattice structure penetrates the light-emitting layer; and forming a p-type layer over the light-emitting layer so that the second lattice structure extends up to the p-type layer or into the p-type layer.

Another aspect of the present invention provides a method for fabricating a light-emitting device. The method comprises: forming a first material layer over a substrate; patterning and etching the material layer to form a first lattice structure from the material layer, wherein the lattice structure extends upward from the substrate; forming a first n-type layer over the substrate so that the first lattice structure is embedded in the first n-type layer; forming a second material layer over the first n-type layer; patterning and etching the material layer to form a second lattice structure from the material layer; forming a second n-type layer over the first n-type layer so that the second lattice structure penetrates the second n-type layer; forming a light-emitting layer over the second n-type layer so that the second lattice structure penetrates the light-emitting layer; and forming a p-type layer over the light-emitting layer so that the second lattice structure extends up to the p-type layer or into the p-type layer.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. Like numbers in the figures refer to like elements throughout, and a layer can refer to a group of layers associated with the same function.

FIGS. 3A-3F illustrate steps of another method to fabricate vertical waveguide of a light-emitting device deposited on a substrate by patterning the substrate and coating the patterned substrate to form a lattice structure.

DETAILED DESCRIPTION OF EMBODIMENTS

Figure 1A:
FIGS. 1A-1E illustrate steps of a method to fabricate vertical waveguide of a light-emitting device deposited on a substrate by patterning the substrate to form a lattice structure.
Figure 1B:
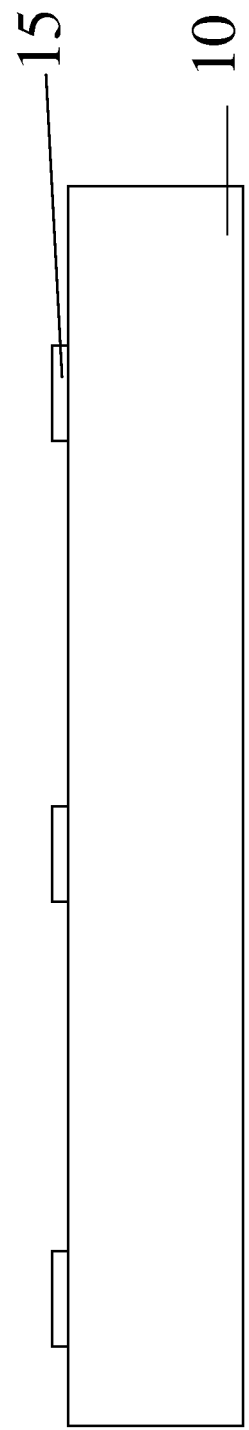
Figure 1C:
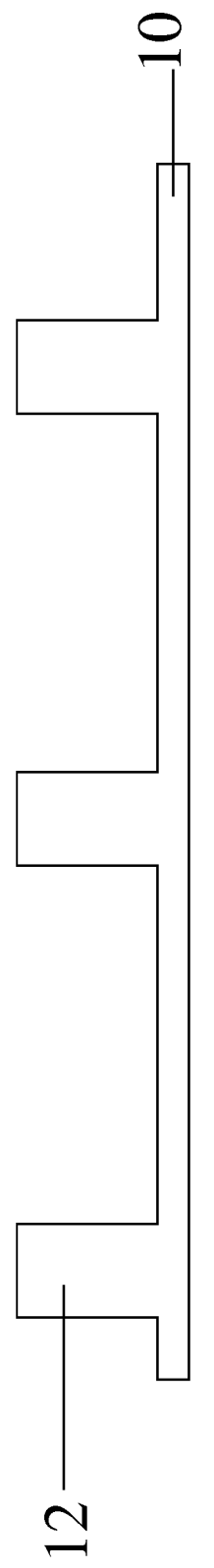
Figure 1D:
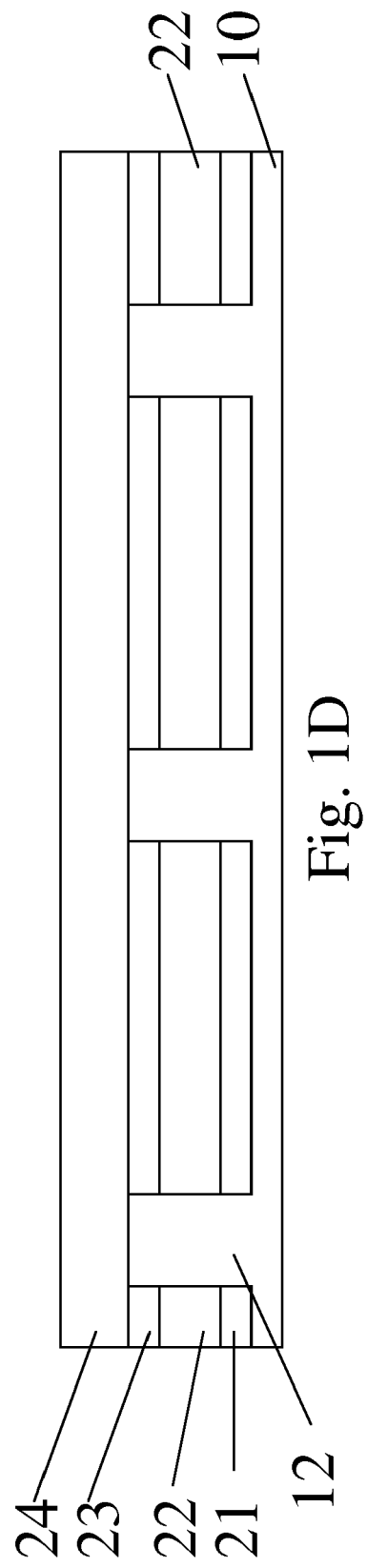
Figure 1E:
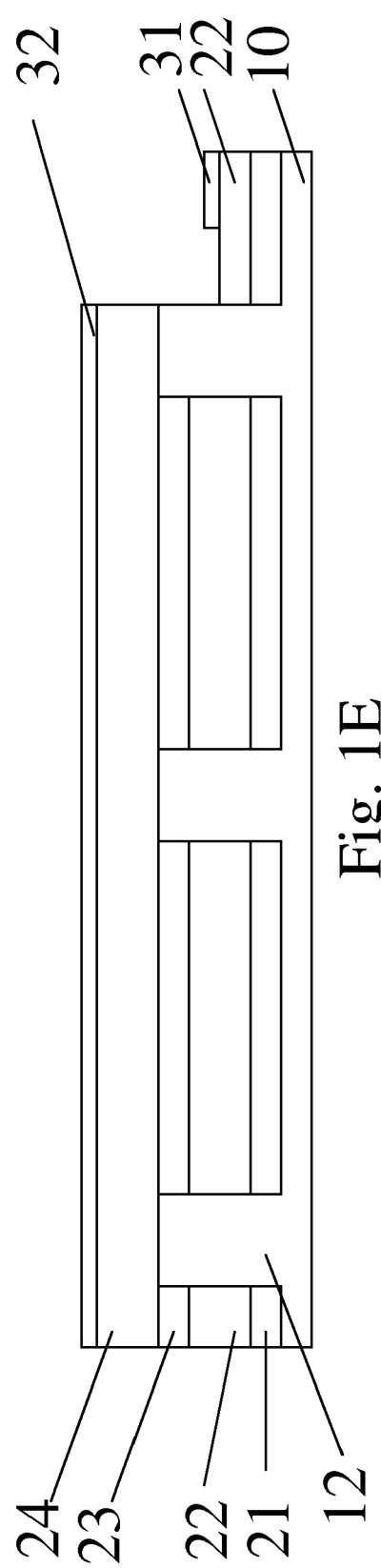

As mentioned above, the conventional light-emitting devices fabricated on foreign substrate suffer from horizontal waveguide effect because of the refractive index mismatch between the device material and the substrate material. The horizontal waveguide effect reduces light extraction efficiency from two aspects. Firstly, for most of the light-emitting devices, except for some edge emitting devices, light emits from top (epilayer) and/or bottom (substrate) side. The horizontal waveguide effect leads to very large angle of incidence of light, where total internal reflection takes place and reduces light extraction efficiency. Secondly, horizontal waveguide effect eventually enlarges light traveling distance within the epilayers, and results in large light loss due to epilayers' self-absorption of the generated light.

Accordingly, the present invention proposes a method to reduce the horizontal waveguide effect and improve light extraction efficiency. Horizontal waveguide effect happens because of the refractive index mismatch of materials in the vertical direction (i.e., layer deposition direction). One aspect of the present invention introduces refractive index mismatch in the horizontal direction (i.e., perpendicular to the layer deposition direction). This mismatch in the horizontal direction results in vertical waveguide effect, hence greatly reduces the light traveling distance and total internal reflection, leading to enhanced light extraction efficiency.

In some embodiments, such as GaN-based LEDs epitaxially deposited on an optically less dense substrate, such as sapphire, quartz, spinel, and the like, the substrate is etched through pre-formed masks, to a predetermined depth, to form a lattice of rods or sheet-shaped sidewalls made of the same substrate. LED growth is then performed on the etched substrate. The remaining sheet-shaped sidewalls or rods are made with small-enough cross-section, that growth of layers on the substrate actually only happens in the etched area, not on top of the rods or the sheet-shaped sidewalls, due to sufficient adatom surface diffusion length under epitaxy temperatures. The etch depth, or the height of the rods/sidewalls is selected to make the rods/sidewalls in the vicinity of the LED active-region (light-emitting medium). In some embodiments, the rods/sidewalls barely punch through the light-emitting layer. The sequential p-type layers' growth planarizes the whole structure. In some embodiments, wherein the substrate has a lower refractive index (say, sapphire, n=1.76) compared to that of the light-emitting structure (say, GaN, n=2.46), the difference in the refractive indexes between the light-emitting structure and the rods/sidewalls implements a vertical waveguide effect, confining light traveling vertically within the structure to the surfaces. These vertical light-guiding rods/sidewalls block the horizontal waveguide effect arising from the refractive index mismatch between the epilayers and the substrate. In conventional LED structures, horizontal dimension is much larger than vertical dimension. For example, the vertical thickness of an LED structure is only a few microns, where the horizontal chip size can be up to millimeters or even larger. The transformation of horizontal waveguide effect into vertical waveguide effect greatly reduces self-absorption loss. At the meantime, the vertical waveguide effect enabling light to strike at the interface between different layers or the medium/air interface with a small angle of incidence, eliminates total internal reflection, and results in an enhanced light extraction efficiency.

In other embodiments, such as GaN-based LEDs epitaxially deposited on sapphire substrate, the substrate is etched through pre-formed masks, to a predetermined depth, to form a lattice of sheet-shaped sidewalls or rods made of the same substrate. The etched substrate is then planarized by performing insulating nitride (GaN, AlGaN, or InGaN) growth, such as epitaxial growth. The planarized substrate is etched for a second time through a second pre-formed masks, leaving the previously formed rods/sidewalls coated with a coating of the insulating nitride layer, with a thickness comparable to the emitted light wavelength in the medium. In this way, a lattice of composite rods or sheet-shaped sidewalls is achieved. LED growth is then performed on the etched substrate with the composite rods or sheet-shaped sidewalls. The composite rods and sidewalls have small enough cross-section in the top view direction, ensuring that growth of layers on the substrate only happens in the etched area, not on top of the sidewalls or the rods, due to sufficient adatom surface diffusion length under epitaxy temperatures. The etch depth, or the height of the lattice structure is selected to make the rods or the sidewalls in the vicinity of the LED active-region, light-emitting medium. In some embodiments, the rods or the sidewalls barely punch through the light-emitting layer. The sequential p-type layers' growth planarizes the whole structure. In these embodiments, where bigger refractive index contrast exists between the rods/sidewalls and the coating thereon, and smaller refractive index contrast exists between the light-emitting layer and the coating, light is confined in the coating and vertically guided to the emitting surfaces. Hence, light is extracted immediately after generation away from the light-generation medium, avoiding the strong self-absorption of the light-generation layer and horizontal waveguide effect.

In still other embodiments, such as GaN-based LEDs epitaxially deposited on sapphire substrate, the substrate is etched through pre-formed masks, to a predetermined depth, to form a lattice of rods or sheet-shaped sidewalls made of the same substrate. These rods/sidewalls are then coated with insulating, transparent materials possessing similar or even larger refractive index than that of GaN, by means of, say, sputtering. The coating materials can be insulating group-III nitride (GaN, InN, AlN, or any ternaries or quaternaries of them), silicon nitride (n=2.1 to 2.3), $TiO_2$ (n=2.6), et al, with a thickness comparable to the emitted light wavelength in the medium. In this way, a lattice of composite rods/sidewalls is achieved. LED growth is then performed on the etched substrate with the composite rods. The composite rods/sidewalls have small enough cross-section in the top view direction, ensuring that growth of layers on the substrate only happens in the etched area, not on top of the rods or the sidewalls, due to sufficient adatom surface diffusion length under epitaxial temperatures.

In still other embodiments, wherein light-emitting device structure is deposited on substrate having similar or larger refractive index compared to that of the light-emitting structure, such as GaN-based LEDs epitaxially deposited on nitride (e.g. GaN) substrate, silicon substrate, gallium arsenide substrate, silicon carbide substrate, and the like, the substrate is etched through pre-formed masks, to a predetermined depth, to form a lattice of rods or sheet-shaped sidewalls made of the substrate. These rods or sidewalls are then coated with insulating, transparent materials possessing smaller refractive index than that of light-emitting structure, by means of, say, sputtering or oxidation. The coated material can be air (n=1), which means there is a substantial gap between the light-emitting structure and the sheet-shaped sidewalls or rods. The coated materials can also be epoxy resin (n=1.4), or $SiO_2$ (n=1.46), with a thickness substantially larger than the emitted light wavelength in the medium. In this way, a lattice of composite sheet-shaped sidewalls/rods is achieved. LED growth is then performed on the etched substrate with the composite sheet-shaped sidewalls/rods. The composite sheet-shaped sidewalls or rods have small enough cross-section, ensuring that growth only happens in the etched area not on top of the sheet-shaped sidewalls or rods, due to sufficient adatom surface diffusion length under epitaxy temperatures. In these embodiments, wherein big refractive index contrast exists between the light-emitting medium and the coating insulating layer of the composite sheet-shaped sidewalls/rods, light is vertically confined in the light-emitting structure and is vertically guided to the emitting surfaces, avoiding the strong self-absorption due to horizontal waveguide effect. These embodiments can result in enhanced light extraction efficiency.

The lattice structure of the vertical waveguide sheet-shaped sidewalls/rods can be a square, rhombus, or any other suitable one or two-dimensional lattice. The cross section of these rods can be circle, rectangle, triangle, hexagonal, or other suitable shape. The side surfaces of the sheet-shaped sidewalls/rods can be vertical, or inclined. The side surfaces can be smooth or rough. The period of the lattice can be adjusted to an optimal number, by compromising the fabrication complexity and the light-extraction effectiveness. And the sheet-shaped sidewalls/rods filling factor, which is defined as the ratio between the total volume of the rods or the sheet-shaped sidewalls of the lattice structure in the light-emitting layer or the light-emitting layer and the volume of the light-emitting layer or the light-emitting layer, can be optimized, by compromising the light-extraction effectiveness and the sacrifice of light-emitting medium. The filling factor can be in the range from 1%-30%, for example less than 10%. But the filling factor is not limited to any particular range as long as the total extracted light with the lattice structure is larger than that without the lattice structure.

This invention because of its uniqueness, allows for the lattice of sheet-shaped sidewalls/rods to be fabricated in prior to the LED epitaxial deposition, eliminating drawbacks associated with other light extraction approaches. For example, in the prior art, photonic crystal approach is in general thought to be effective to enhance light extraction. The photonic crystal approach usually etches out holes to modulate refractive index of the LED, expecting to have enhanced light extraction efficiency in accordance with the physics of photonic crystal. However, the photonic crystal fabrication process leaves large damaged surface areas within the LED. Surface, especially damaged surface, acts as non-radiative recombination path. When presented in the vicinity of the MQW, these surfaces will reduce the MQW internal quantum efficiency dramatically.

FIGS. 1A-1E illustrate a method of introducing vertical waveguide into a light-emitting device grown on foreign substrate, for example, nitride-based light-emitting diodes (LED) grown on a sapphire substrate. The substrate may have a refractive index smaller than that of the epi-layers in the light emitting device. The method starts with supply of a substrate 10, forming an etch-protection mask 15 over substrate 10, and etching substrate 10 in the presence of mask 15, via ion-coupled plasma reactive ion etching (ICP-RIE) or any other suitable known etching methods, to fabricate a lattice structure including plurality of rods 12 formed from substrate material 10. Rods 12 extend substantially in the vertical direction (i.e., layer deposition direction). The lattice structure also can be made of a plurality of sheet-shaped sidewalls 12' extending substantially in the vertical direction as shown in FIGS. 5-11. Then the so-prepared substrate 10 is loaded into a growth reactor, such as reactors of metalorganic chemical vapor deposition (MOCVD), molecular beam epitaxy (MBE), hydride vapor phase epitaxy (HVPE), or the like reactor to carry out the device epitaxial growth. The device structure formed by epitaxial growth includes an insulating buffer layer 21, an n-type electron supplier layer 22, an light-emitting layer 23, and a p-type hole supplier layer 24. To function as an electrical device, finally there are an n-electrode 31, and a p-electrode 32. The p-electrode 32 is preferably to be transparent.

Typically, for nitride-based visible LEDs, the substrate 10 can be a transparent sapphire wafer. The insulating buffer layer 21 can be made of undoped GaN or AlGaN, with a thickness ranging from 0.1 to 1 μm. The resistivity of layer 21 is preferably above 100 Ω/cm. N-type electron supplier layer 22 can be a silicon-doped GaN layer, with a thickness from 1 to 5 μm, and a sheet resistance preferably below 30 Ω·cm. N-type electron supplier layer 22 can be a single layer or contain several n-type layers made of AlInGaN with different bandgap offsets (hence different composition of Al, In, Ga), in order to obtain high electron injection efficiency into the light-emitting layer 23. The light-emitting layer 23 is often made of material(s) of lower bandgap than those of the n-type electron supplier layer 22 and p-type hole supplier layer 24. Light-emitting layer 23 can be a single layer of InGaN, or other suitable material conventionally used as light-emitting medium, or a single or multiple quantum well including well(s) and barrier(s). P-type hole supplier layer 24 is typically magnesium doped GaN, with a thickness from 50 to 500 nanometers, and resistivity 0.2 to 2 Ω·cm. P-type hole supplier layer 24 can be a single layer or contain several other p-type layers made of AlInGaN with different bandgap offsets (hence different composition of Al, In, Ga), in order to obtain high hole injection efficiency into the light-emitting layer 23. N-electrode 31 can be made of thin Ti/Al alloys and a thick metal pad, such as Au. P-electrode 32 can be made of thin Ni/Au alloys and a thick metal pad, such as Au, or a transparent conducting oxide (TCO) layer, such as indium tin oxide (ITO).

Generally speaking, the n-type layer, the light-emitting layer, and the p-type layer in the present invention can be any conventional n-type layer, p-type layer, and quantum well layer as used in light-emitting devices or light-emitting diodes.

One aspect of the present invention also provides vertical waveguide solution for light-emitting devices grown on light absorbing substrates. Light absorbing substrates usually have a larger refractive index than that of the light-emitting device grown thereon. For example, this case includes nitride-based visible LEDs grown on silicon, gallium arsenide, and silicon carbide substrate. Substrate 10 can be one of these light absorbing substrates.

The lattice structure according to some embodiments of the present invention include plurality of rods which implement vertical waveguide effect, because of its lower refractive index (say, sapphire, n=1.76) compared to that of the n-layer, the p-layer and the light-emitting layer of a LED (say, GaN, n=2.46). These vertical wave-guiding rods block the horizontal waveguide effect arising from the refractive index mismatch between the epilayers (e.g., the n-layer, the p-layer and the light-emitting layer of a LED) and the substrate. In conventional LED structures, horizontal dimension is much larger than vertical dimension. For example, the vertical thickness of an LED structure is only a few microns, where the horizontal chip size can be up to millimeters. The transformation of horizontal waveguide effect into vertical waveguide effect greatly reduces self-absorption loss. At the meantime, the vertical waveguide effect enabling light to strike at the medium/air interface with a small angle of incidence, eliminates total internal reflection, and results in enhanced light extraction efficiency.

Figure 16:
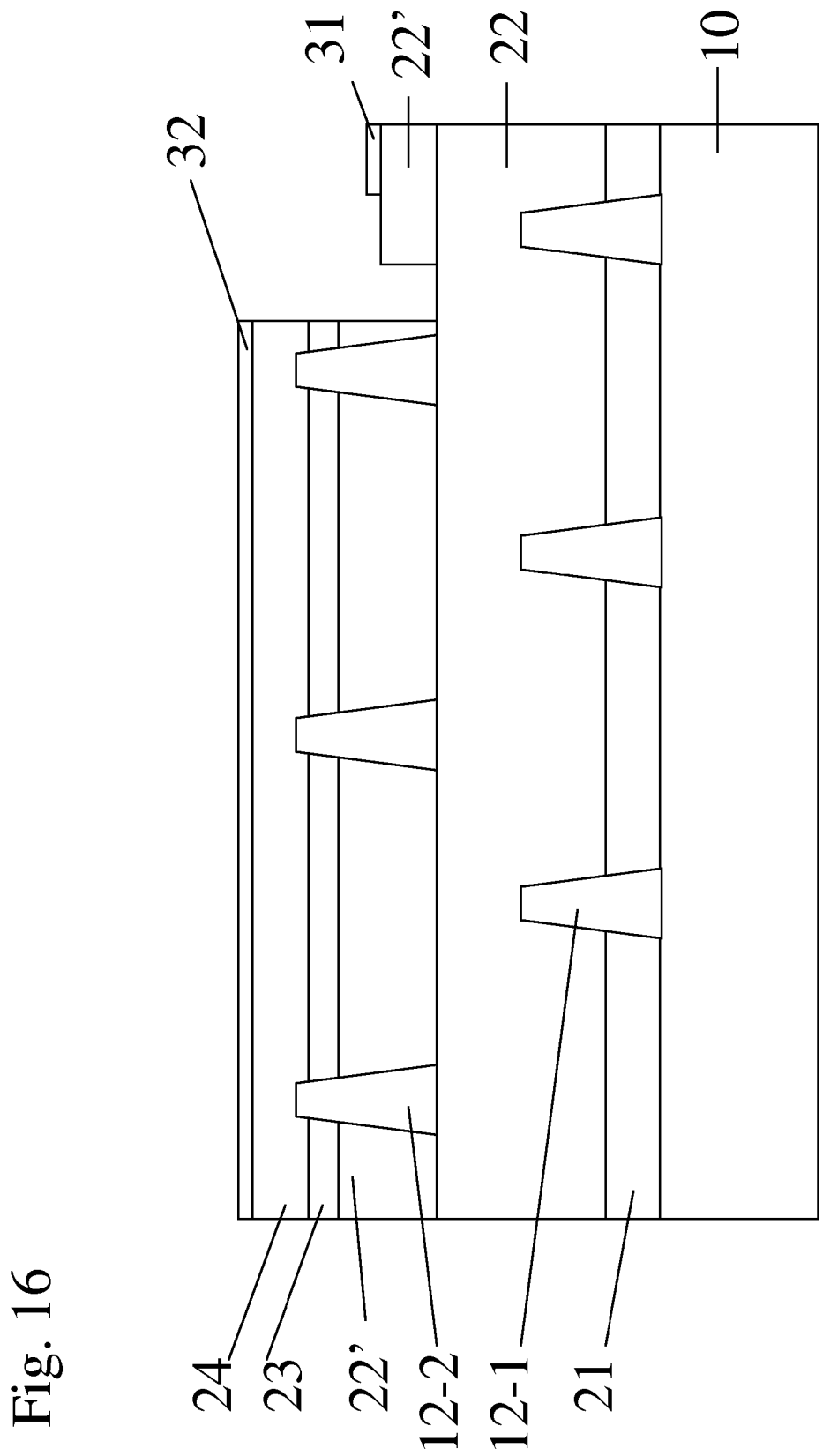
FIG. 16 illustrates the cross-sectional view of the light emitting device as shown in FIG. 15, but with a lattice structure that has inclined sidewalls or rods.
Figure 17:
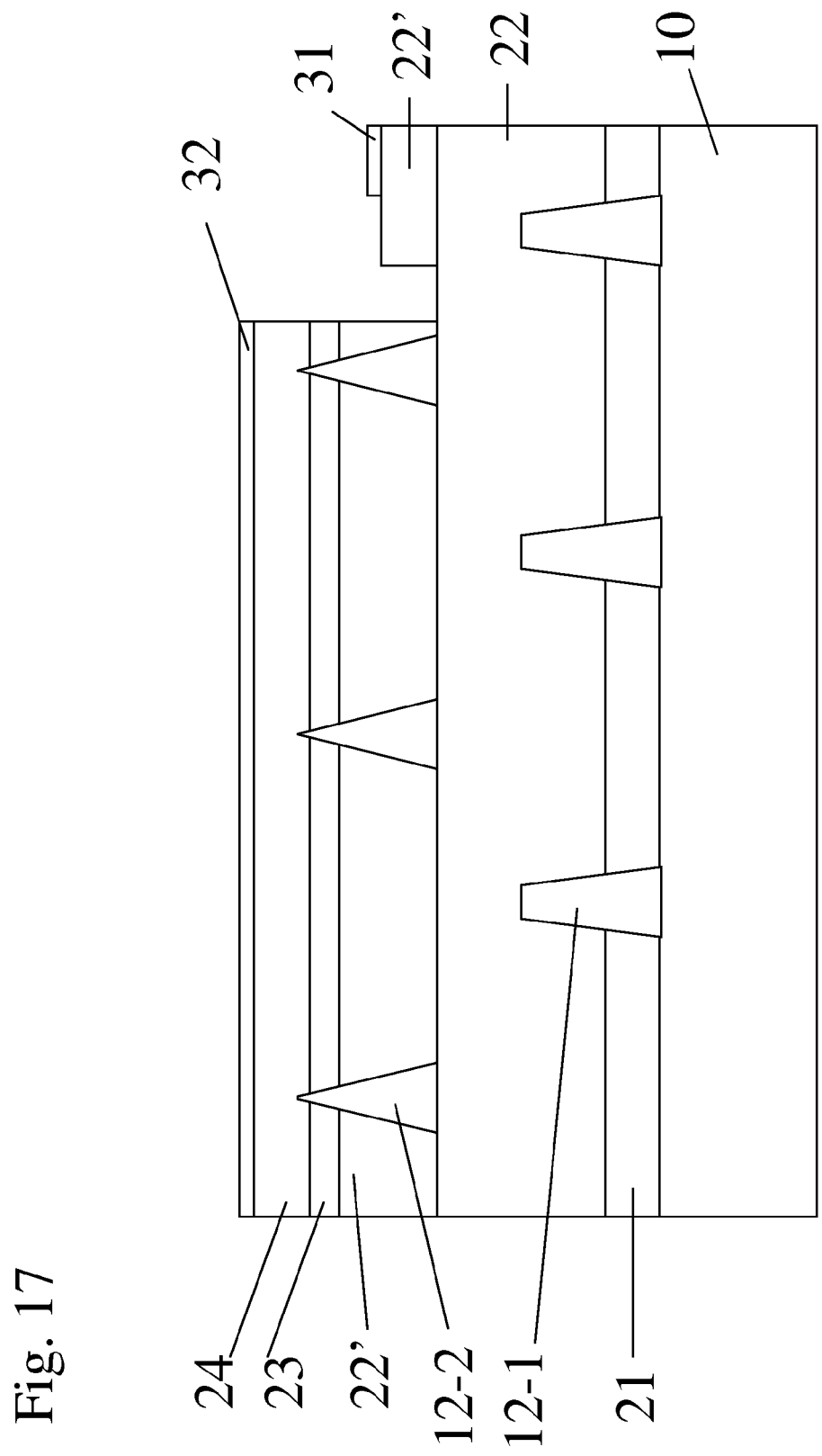
FIG. 17 illustrates the cross-sectional view of the light emitting devices shown in FIG. 15, but with a lattice structure that has inclined sidewalls or rods.
Figure 18:
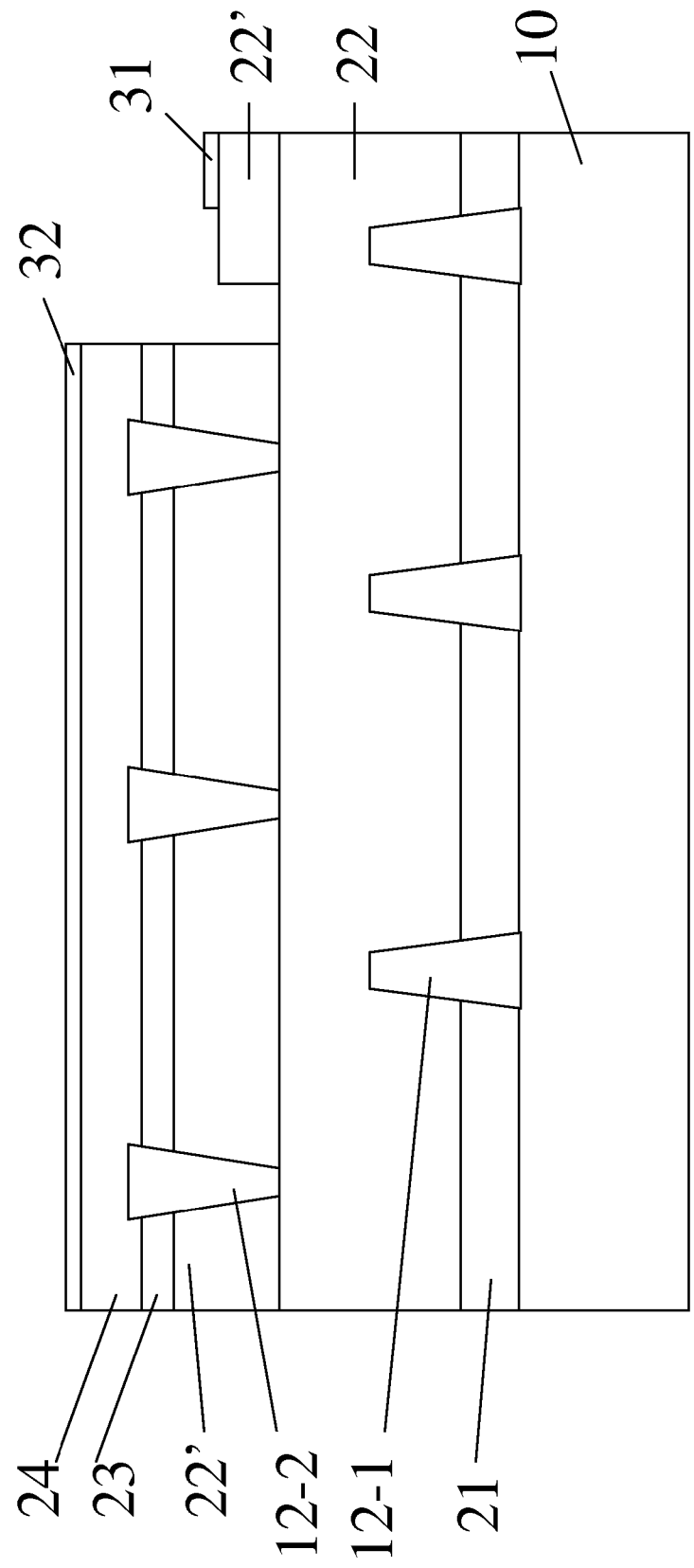
FIG. 18 illustrates the cross-sectional view of the light emitting devices shown in FIG. 15, but with a lattice structure that has inclined sidewalls or rods.

The etching depth, or the height of rods 12 or sidewalls 12' can be in the range of 1 to 10 microns, being selected to make the rods/sidewalls in the vicinity of the light-emitting layer. In some embodiments, the rods/sidewalls barely punch through the light-emitting layer and barely punch into the p-type hole supplier layer. The sequential p-type layer's growth planarizes the whole structure. In other embodiments, the rods/sidewalls also punch through the p-type hole supplier layer. The cross-section area of rod 12/sidewall 12' in the top view direction can be made small enough, to make sure that growth of the n-type layer and the light-emitting layer only occurs in the etched area, not on top of the rods/sidewalls, due to sufficient adatom surface diffusion length under epitaxy temperatures. In some embodiments according to this invention, when the vertical waveguide is made of vertical rods 12 (refer to FIGS. 1, 12 and 13), the cross-section dimension (d) of rod 12 typically is in the range of 500 nm to 5 μm, but, it is not limited thereto. Especially, the dimension (d) can be made as small as possible, for example, between 200 and 400 nm, but smaller dimension (d) will increase the manufacturing cost. The cross-section shape of rod 12 can be of circle, square, triangle, pentagon, or hexagonal shape, or the like. The cross-section dimension (d) of rod 12 may be substantially the same along the vertical direction, or may increase or decrease upward from the substrate along the vertical direction as shown in FIGS. 16-18. Rod 12 may also have a varying composition, thus, a varying refractive index, along the vertical direction, for example, a gradually reducing or increasing refractive index from bottom to top of rod 12.

The side surface of rods 12 of the lattice structure can be substantially perpendicular to the substrate, or inclined within a small angle with respect to the substrate surface normal. The inclined angle is preferably in the range of −15 to 15 degrees. The surfaces of rods 12 are preferably to be optically smooth, though rough surfaces can also be implemented in some embodiments.

Figure 12:
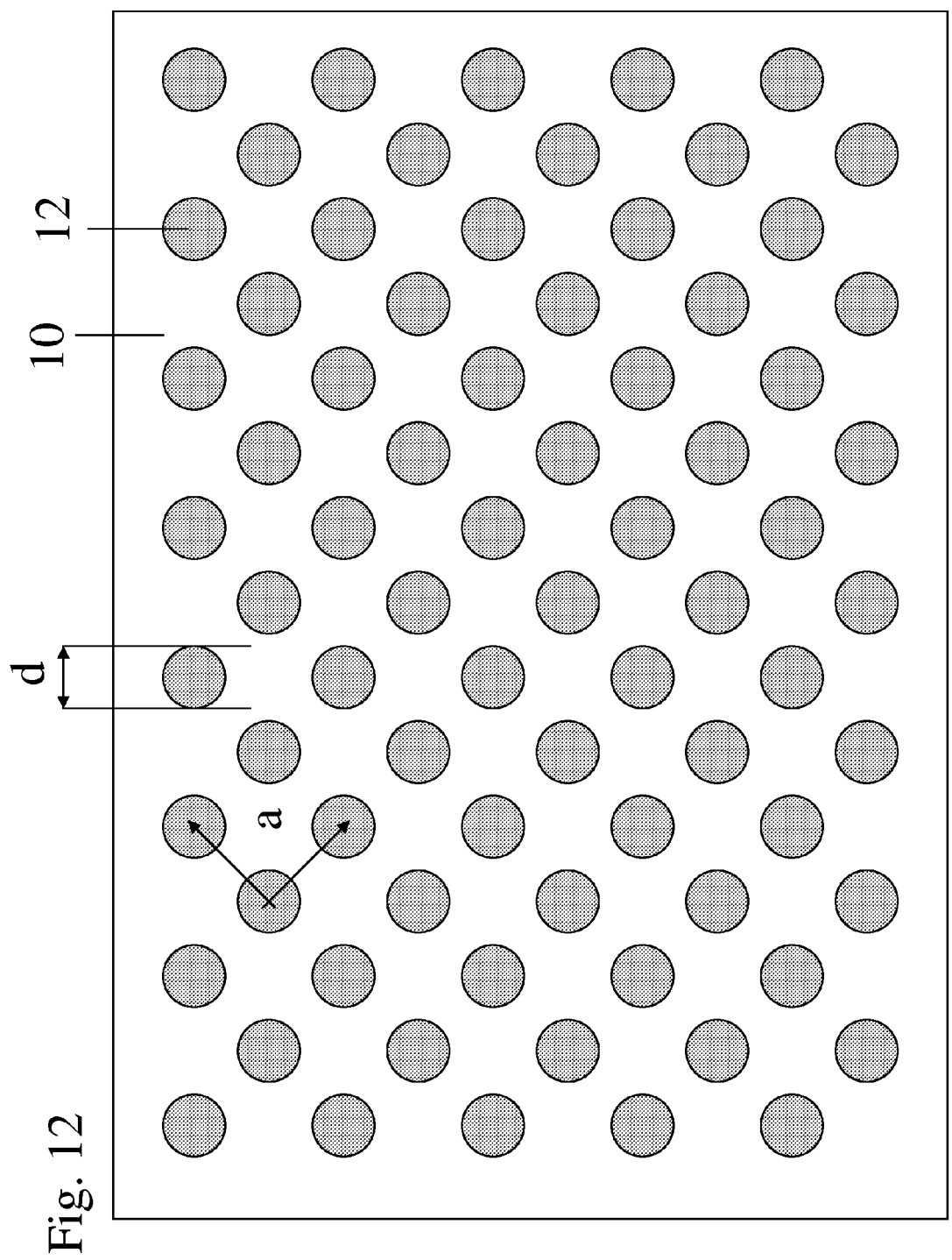
FIG. 12 is a top view of a two-dimensional square lattice structure made of vertical rods.
Figure 13:
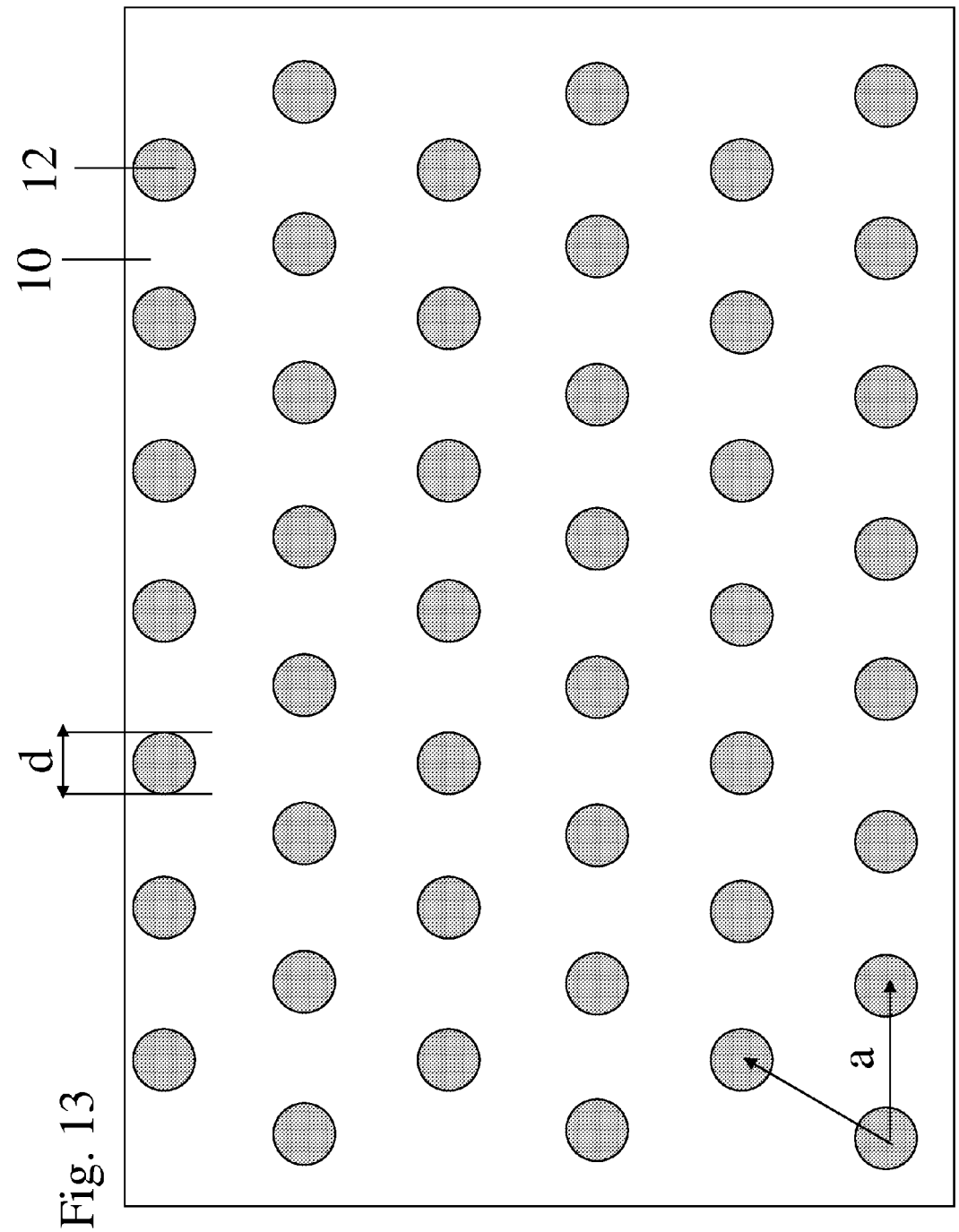
FIG. 13 is a top view of a two-dimensional rhombus/hexagonal lattice made of vertical rods.
Figure 14:
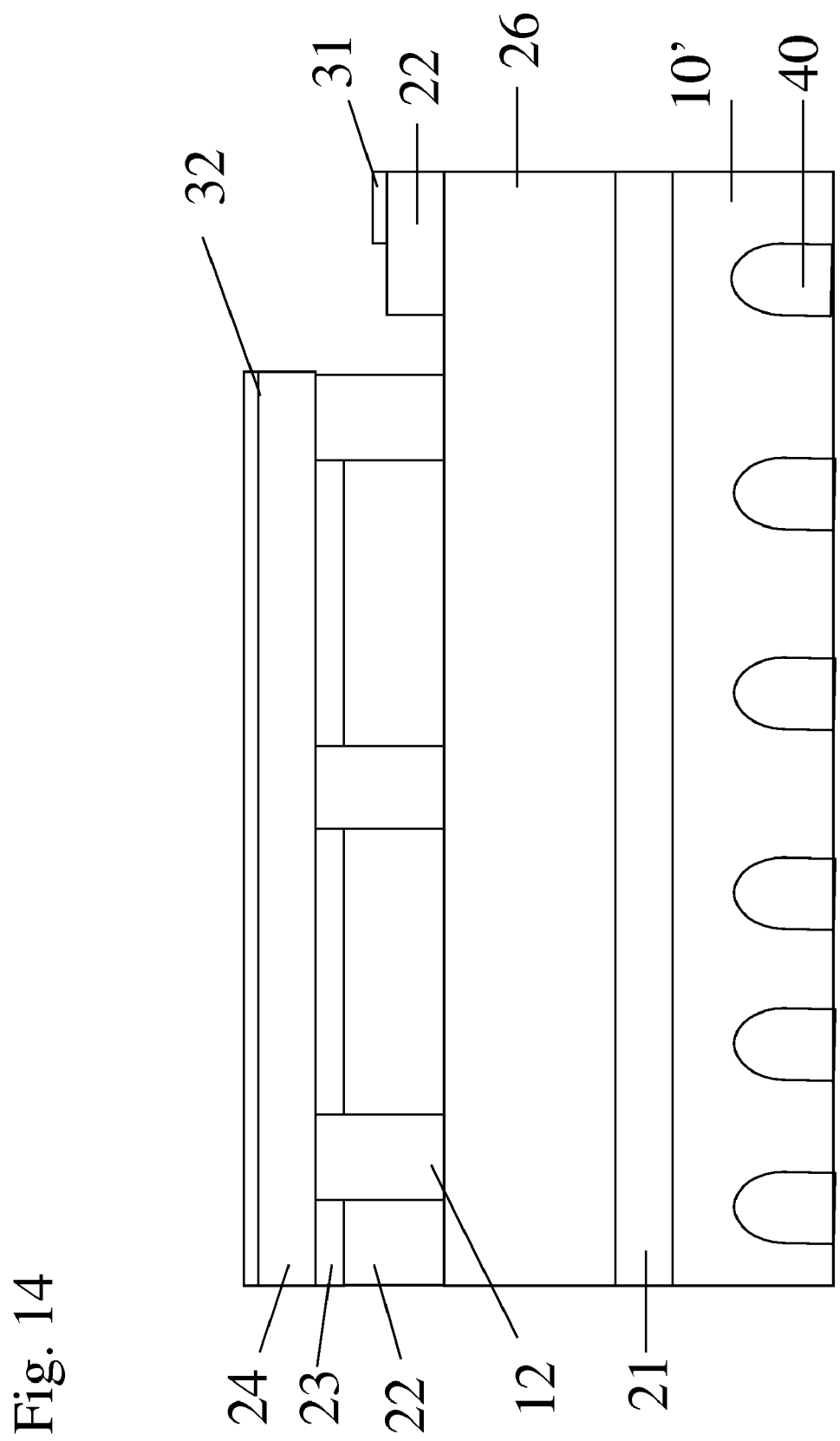
FIG. 14 illustrates the cross-sectional structure of a light emitting device with a lattice structure grown on one side of a substrate and another lattice structure is formed in the substrate from another side thereof.

The lattice structure of rods 12 can be of any two-dimensional lattice, or arranged randomly. For example, it can be a square lattice (refer to FIG. 12). In FIG. 12, round rods 12 forming a square lattice, with the rod cross-sectional diameter, d, being from 500 nm to 5 μm, lattice constant, a, being from 2 d to 10 d, i.e., from 1 to 50 μm. The lattice structure can also be a general rhombus lattice. In FIG. 13 a special rhombus lattice, hexagonal lattice is presented. Here the lattice constant and cross-sectional diameter fall into the same range mentioned above. Rods 12 can also be randomly arranged.

In another aspect of the present invention, the lattice structure is made of sheet-shaped sidewalls 12' (refer to FIGS. 5-11) penetrating through the n-type electron supplier layer and the light-emitting layer. In some embodiments according to the present invention, the thickness (d) of sidewall 12' is from 200 nm to 2 μm. But, it is can be thinner than 200 nm or thicker than 2 μm. The period (a) of the lattice structure of sidewalls 12' can be, but is not limited to, from 5 to 50 μm (FIGS. 5, 6, 10, and 11), The sidewalls 12' of the lattice structure can be substantially perpendicular to the substrate 10, or inclined within a small angle with respect to the substrate surface normal. The inclined angle is preferably in the range of −15 to 15 degrees. The surface of sidewalls 12' are preferably to be optically smooth, though rough surface can also be implemented in some embodiments. The thickness (d) of sidewall 12' may be substantially the same along the vertical direction, or may increase or decrease upward from the substrate along the vertical direction as shown in FIGS. 16-18. Sidewall 12' may also have a varying composition, thus a varying refractive index, along the vertical direction, for example, a gradually reducing or increasing refractive index from bottom to top of sidewalls 12'.

Sidewalls 12' and rods 12 can be fabricated in the same manner through the same or similar process. Therefore, rods 12 shown in FIGS. 1A-11E, 2A-2C, 3A-3F, 4A-4B, and 14-18 can be replaced by sheet-shaped sidewalls 12'.

Figure 5:
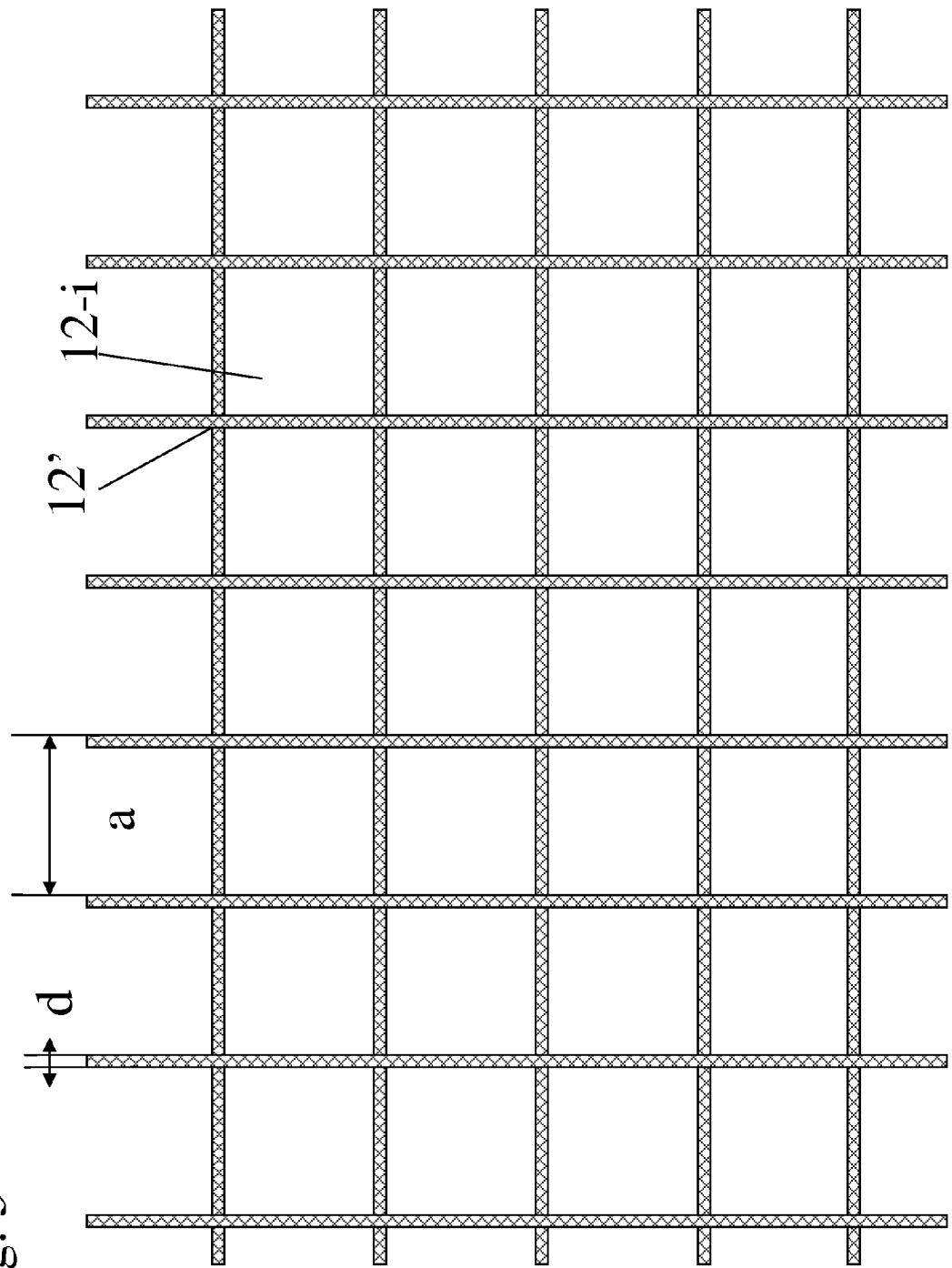
FIG. 5 is a top view of a two-dimensional lattice structure with closed area units of square-shape serving as vertical waveguide.
Figure 6:
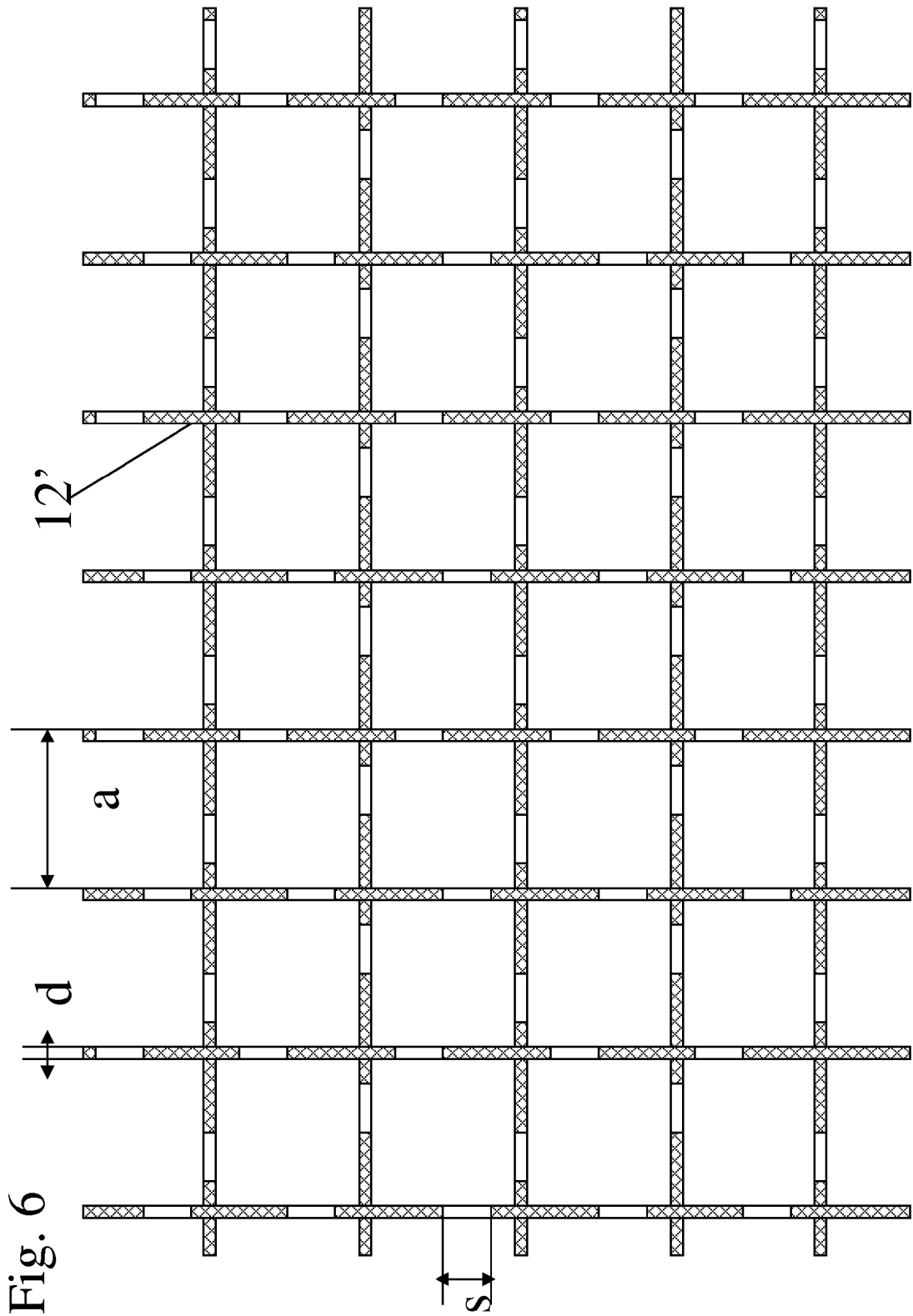
FIG. 6 is a top view of a two-dimensional lattice structure with semi-closed area units of square-shape serving as vertical waveguide.
Figure 7:
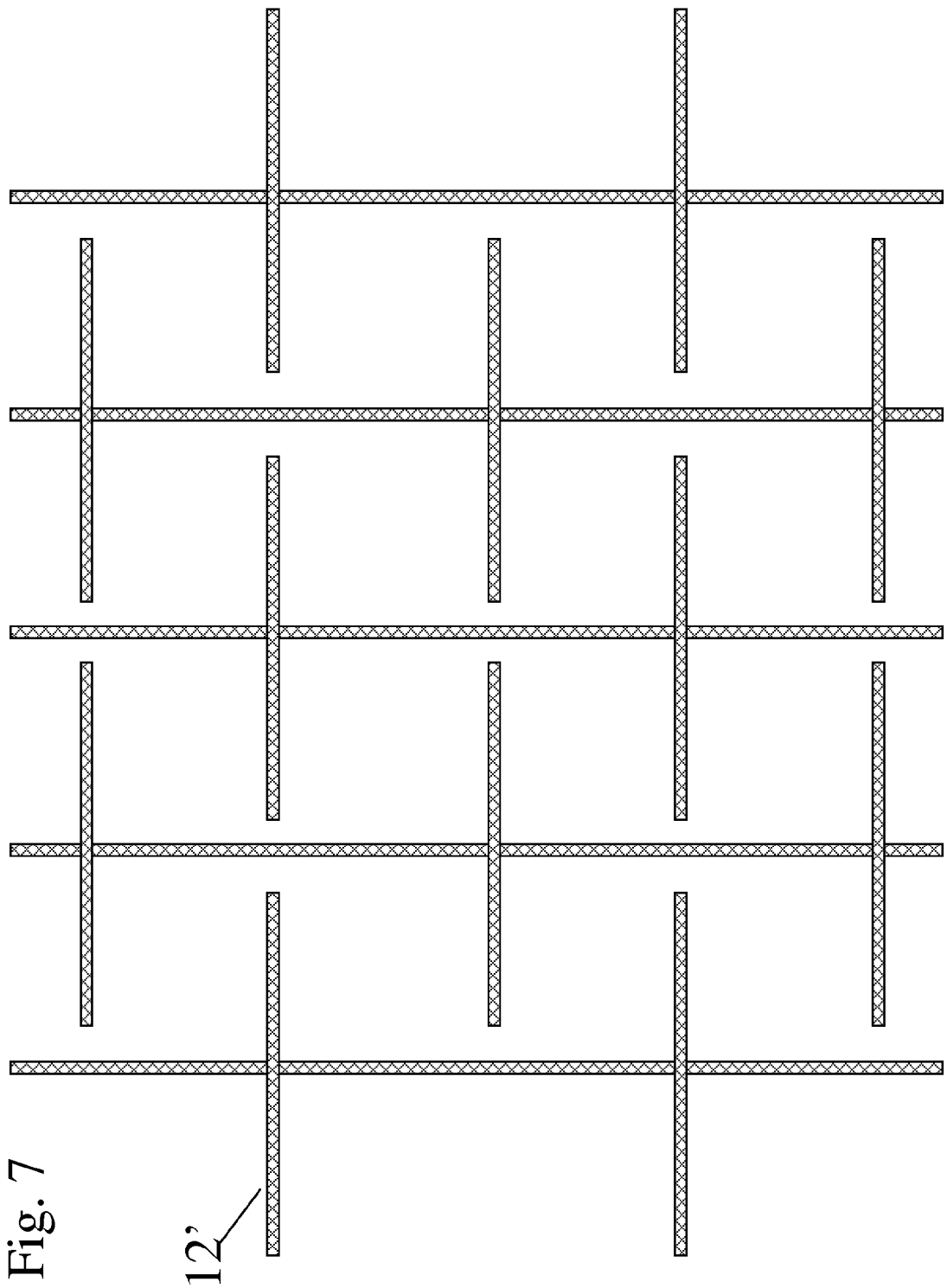
FIG. 7 is a top view of a one-dimensional lattice structure with semi-closed area units serving as vertical waveguide.
Figure 8:
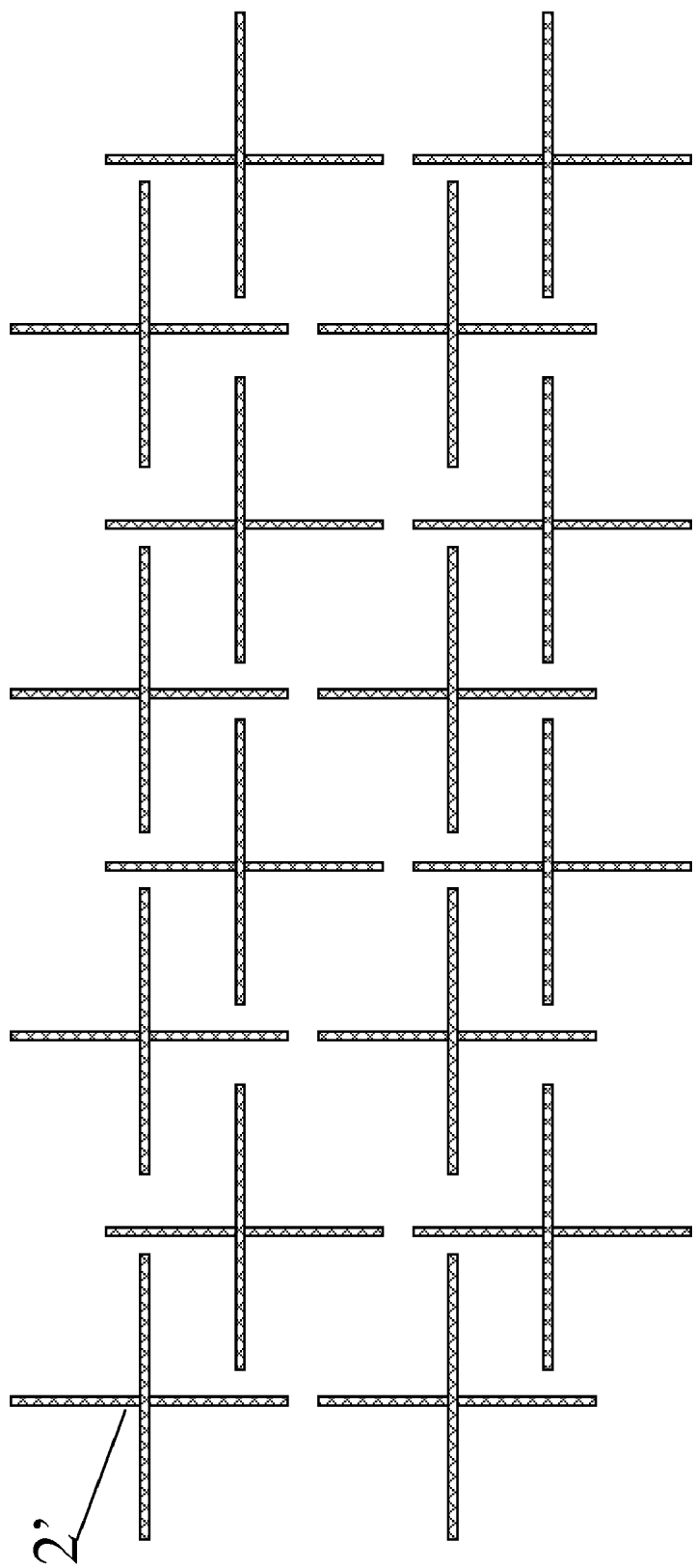
FIG. 8 is a top view of another two-dimensional lattice structure with semi-closed area units serving as vertical waveguide.
Figure 9:
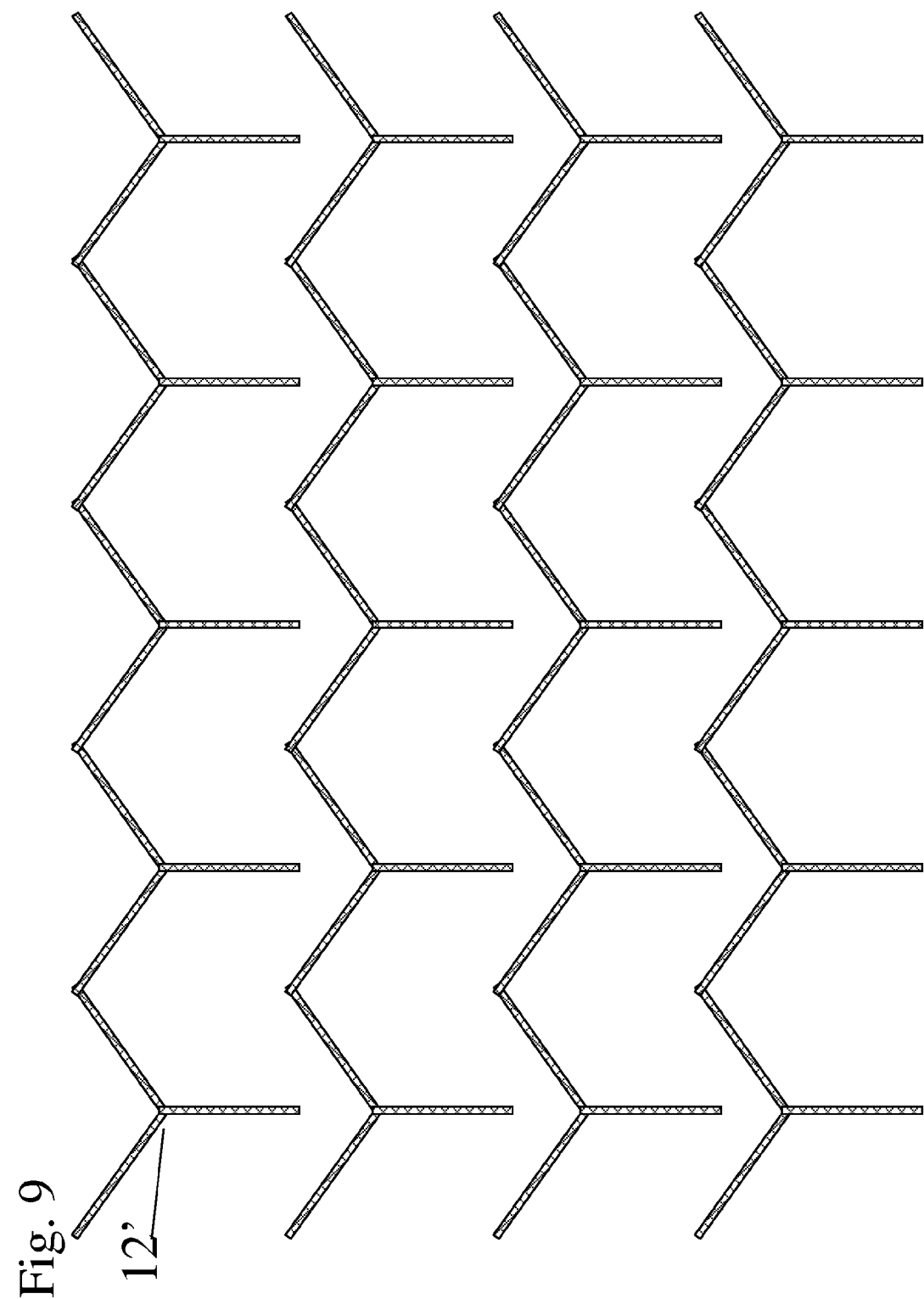
FIG. 9 is a top view of a one-dimensional lattice structure with semi-closed area units having repeating zigzag sidewalls combined with straight sidewalls: "Y" sidewalls.

Sidewalls 12' of the lattice structure divide the light-emitting layer and the n-type layer (also the p-type layer if sidewalls 12' punch through the p-type layer) into a plurality of area units such as area unit 12'-*i* as shown in FIGS. 5 and 6, arbitrarily or in certain patterns.

The area units can be closed area units, i.e., the area units are totally separated from each other by sidewalls 12'. Therefore, light traveling horizontally in an area unit will be blocked by the sidewall 12' surrounding that area unit, which significantly reduces the distance traveled by the light within the light-emitting layer, the n-type layer, or the p-type layer before it is extracted from the light-emitting device. As a result, the horizontal waveguide effect is significantly suppressed and the absorption loss is greatly reduced. An example of the closed area units are shown in FIG. 5. For example, each repeating square surrounded by sidewall 12' as shown in FIG. 5 represents a closed area unit 12'-*i*. The area unit can have the shape of rhombus, pentagon, hexagonal, or any other shapes that can fill the two-dimensional space by translation, or any other random shapes.

The area units can be semi-closed area units, i.e., the area units are partially separated from each other by sidewalls 12', but still in direct connection with each other. Some examples of the semi-closed area units are shown in FIGS. 6-11. Therefore, light traveling horizontally in an area unit will be mostly blocked by the sidewall 12' surrounding that area unit, only a small portion of the light travels horizontally out of an area unit and enters the adjacent area units, which can also significantly reduce the average distance traveled by the light within the light-emitting layer, the n-type layer, or the p-type layer before it is extracted from the light-emitting device. A feature of the semi-closed area units is that electrical connection, for example in the n-type layer, between the area units is maintained. A semi-closed area unit can be obtained by having a gap "s" in sidewall 12' as shown in FIG. 6. A lattice structure of semi-closed area units can also be formed by area units randomly divided by sidewalls 12'.

If each area unit 12-*i* is viewed as a cylindrical or disk-shaped body, the sidewall of the cylindrical or disk-shaped body is completely surrounded by sidewall 12' of the lattice structure for a closed area unit, while the sidewall of the cylindrical or disk-shaped body is only partially surrounded by sidewall 12' for a semi-closed area unit, leaving a portion of the sidewall of the cylindrical or disk-shaped body uncovered by the sidewall 12'. The enclosure degree of an area unit 12-*i* is defined as the ratio between the area of the sidewall of the cylindrical or disk-shaped body that is covered by the sidewall 12' and the total area of the sidewall of the cylindrical or disk-shaped body. Preferably, the enclosure degree is equal to or larger than 50%, more preferably equal to or larger than 70%. In some embodiments according to the present invention, the enclosure degree is designed in the range between 20%-50%. In some embodiments according to the present invention, the enclosure degree is designed in the range between 80%-95%. When the enclosure degree approaches to 100%, the area unit becomes a closed area unit.

Another factor to be considered about the lattice structure of robs 12/sidewalls 12' is the filling factor which is defined as the ratio between the volume occupied by the sidewalls 12' or rods 12 in the light-emitting layer and the total volume of the light-emitting layer. The filling factor preferably is in the range of 8-20%, and can be made below 8% as long as a minimum thickness of sidewalls 12' is obtainable and still able to function as intended.

Figure 2A:
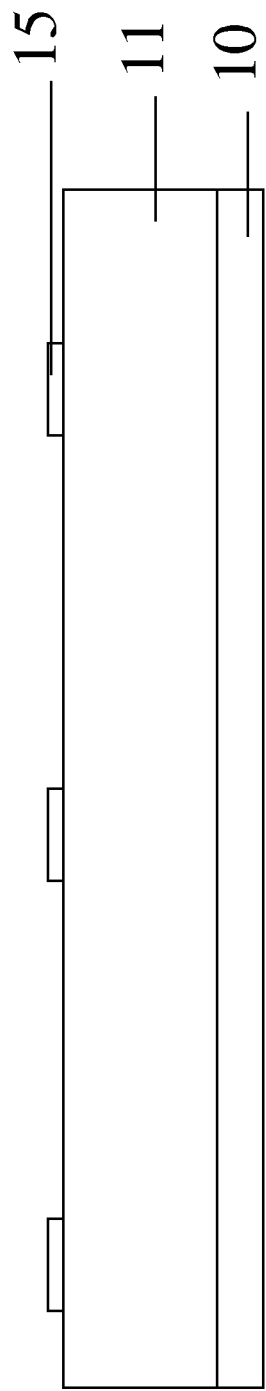
FIGS. 2A-2C illustrate steps of a method to fabricate vertical waveguide of a light-emitting device by patterning a material layer deposited on a substrate to form a lattice structure.

The rods 12 or sheet-shaped sidewalls 12' of the lattice structure can also be made from materials that are different from the substrate and with smaller, or similar, or large refractive indexes compared to that of the light-emitting layer. Candidate materials include, but not limited to, epoxy resin (n=1.4), $SiO_2$/glass (n=1.46), sapphire (n=1.76), ITO (n=1.8), $SiN_x$ (n=2.1), group-III nitride (AlInGaN, n>=2.2), $TiO_2$ (n=2.6), GaP (n=3.3), ZnO, and other transparent metal oxides. This means that instead of etching a substrate as shown in FIGS. 1A-1E, the substrate is first coated with a single layer of material or multiple layers of materials listed above or other suitable materials. In FIG. 2A, on a substrate 10, a single layer or multiple layers of material 11 are deposited to a thickness greater than 1 µm, more preferably greater than 4 µm. Then per the protection of mask 15 and ICP-RIE etching of layer 11, the remaining portions of layer 11 forms rods 12, or sidewalls 12', or the mixture of the two in FIG. 2B. Similar to the process steps in FIGS. 1D and 1E, epilayer structure and device are formed in FIG. 2C which include an insulating buffer layer 21, an n-type electron supplier layer 22, a light-emitting layer 23, a p-type hole supplier layer 24, a transparent p-type contact layer 32, and an n-type contact layer 31. The vertical height of rods 12 or sidewalls 12' is in the range of 1 to 10 microns, being selected to make the rods 12/sidewalls 12' penetrate the light-emitting layer 23. In some embodiments, the rods 12/sidewalls 12' penetrate the n-type layer 22 and barely punch through the light-emitting layer 23. In this case, the growth of the p-type hole supplier layer 24 planarizes the structure. In some embodiments, the rods 12/sidewalls 12' also punch through p-type layer 24. In this case, the additional transparent p-type contact layer 32, such as ITO, planarizes the structure.

When layer 11 in FIG. 2A is formed by multiple layers of materials, rods 12/sidewalls 12' with grading refractive index along vertical direction can be obtained. This will further enhance the vertical light extraction efficiency. In some embodiments, rods 12/sidewalls 12' are made to have a refractive index above 2.46 in the vicinity of the light-emitting layer or the light-emitting layer 23, by depositing $TiO_2$ or GaP, and to have a decreasing refractive index as getting further way from the light-emitting layer 23, by depositing AlGaN, $SiN_x$, ITO, and $SiO_2$ in turn. By choosing multiple layers with different refractive index, or by choosing a single layer doped with different concentration or type of dopants, a desirable profile of refractive index along the vertical direction of the light emitting device can be achieved.

Figure 3A:
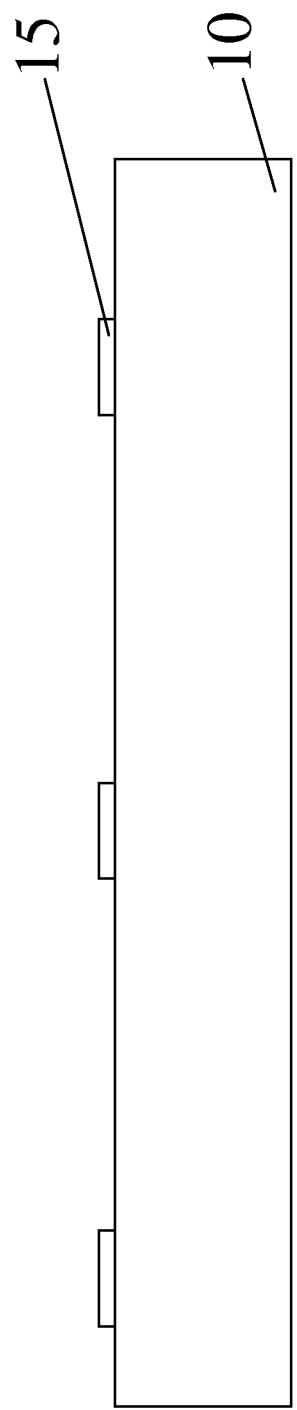
Figure 3B:
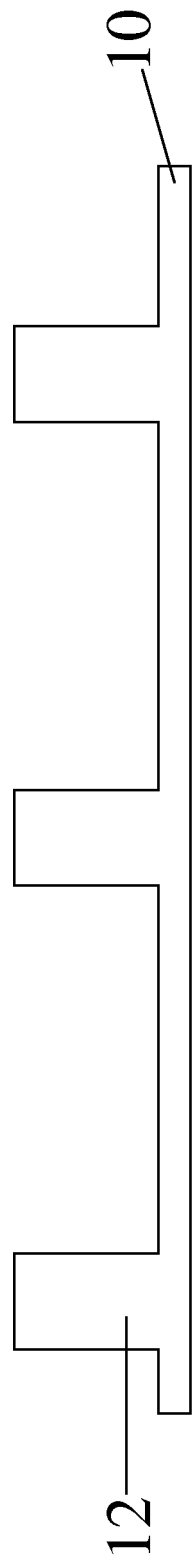
Figure 3C:
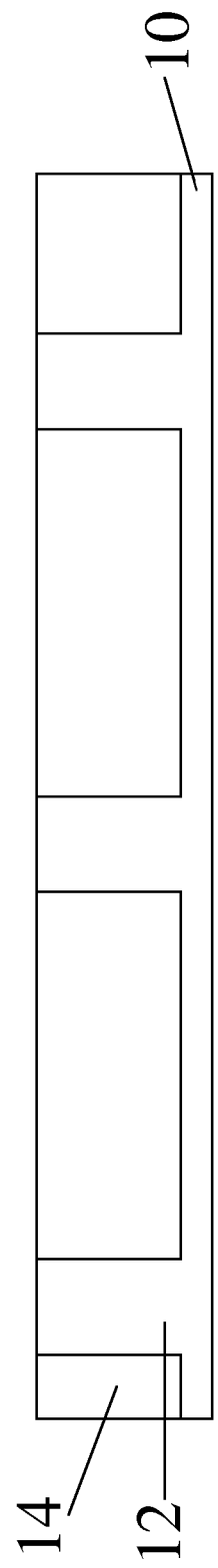

FIGS. 3A-3F illustrate another method of making vertical light guiding structure. It differs from FIGS. 1A-1E in that the rods 12/sidewalls 12' are coated, by growth and re-etching, with a high-quality insulating layer such as GaN or AlGaN layer on their vertical walls. To obtain the high-quality insulating layer, epitaxial growth of a nitride layer or other suitable material layer is conducted on rods 12/sidewalls 12' over substrate 10. This high-quality coating serves the LEDs better under certain circumstances. Firstly, it greatly reduces interface defects between the rods 12/sidewalls 12' and the light-emitting structure which includes the light-emitting layer, the n-type layer and the p-type layer. Secondly, it can extract light out of the light-emitting structure, into the coating layer, further reducing the self-absorption light loss. FIGS. 3A-3B are identical to FIGS. 1B-1C. In FIG. 3C, a high-quality insulating layer 14 of GaN, AlGaN, or InGaN is epitaxially deposited on rods 12/sidewalls 12' over the etched substrate 10. After planarization, a further etch step is perform to etch away most of the insulating layer 14 leaving only a thin conformable layer 14', for example with a thickness of 200 nm to 1000 nm, on the rods 12/sidewalls 12' (FIG. 3D). Conformable layer 14' covers rods 12/sidewalls 12' and, may or may not, also cover substrate 10. When conformable layer 14' covers substrate 10, it can be made to function as an insulating buffer layer for epitaxial growth of n-type electron supplier layer 22 or other suitable layer thereon. If a portion of conformable layer 14' is removed to expose substrate 10, an optional buffer layer, such as buffer layer 21 as shown and described in FIG. 1D, can be formed on substrate 10 for the growth of n-type electron supplier layer 22 thereon. In this way, a lattice of composite rods 12 and/or sidewalls 12' is achieved. LED growth is then performed on the etched substrate with the composite rods 12/sidewalls 12'. The composite rods 12/sidewalls 12' have small enough cross-section in the top view direction, ensuring that growth of the n-type electron supplier layer 22, the light-emitting layer 23, and other layers penetrated by rods 12/sidewalls 12' only happens in the etched area, not on top of the rods 12/sidewalls 12', due to sufficient adatom surface diffusion length under epitaxy temperatures. The etch depth, or the height of rods 12/sidewalls 12' is selected to make the rods 12/sidewalls 12' penetrate the light-emitting layer 23. In some embodiments, the rods 12/sidewalls 12' penetrate the n-type electron supplier layer 22 and barely punch through the light-emitting layer 23. In this case, the growth of p-type layer 24 planarizes the structure. In some embodiments, bigger refractive index contrast exists within the composite rods/sidewalls, and smaller refractive index contrast exists between the light-emitting layer 23 and the conformable layer 14', light is confined in the conformable layer 14' and vertically guided to the emitting surfaces. Hence, light is extracted immediately away from the light-emitting layer after its generation, avoiding the strong self-absorption of the light-emitting layer and horizontal waveguide effect. These embodiments can result in even better enhanced light extraction efficiency.

An alternative way of forming insulating conformable layer 14' as shown in FIGS. 3A-3F is to coat rods 12/sidewalls 12' by sputtering, not epitaxial growth, with one or more transparent layers possessing similar or higher refractive index than that of the light-emitting layer 23. In this case, the sputtering coated insulating conformable layer 14' can be made of gallium-containing nitride, silicon nitride (n=2.3), $TiO_2$ (n=2.6), or the like.

Still referring to FIGS. 3A-3F, in this embodiment, light-emitting devices are grown on a light absorbing substrate 10, which has a larger refractive index than that of n-type layer 22, light-emitting region 23, and p-type layer 24. For example, this case includes nitride-based visible LEDs grown on silicon, gallium arsenide, and silicon carbide substrate. In this embodiment, the insulating layer 14 has a smaller refractive index compared to that of n-type layer 22, light-emitting region 23, and p-type layer 24. In the case of nitride-based visible LEDs grown on Si, SiC, GaAs, and the like, insulating layer 14 can be made of epoxy resin (n=1.4), $SiO_2$ (n=1.46), or $Al_2O_3$ (n=1.76) with a thickness comparable to the emitted light wavelength in the medium (200 nm to 1000 nm). Insulating layer 14 can be deposited on rods 12/sidewall 12' by any conventional depositing method and converted into a conformable layer 14' by etching. In this way, a lattice structure of composite rods 12/sidewalls 12' is achieved. The epitaxial growth of n-type layer 22, light-emitting region 23, or p-type layer 24 is then performed on the etched substrate with the composite rods 12/sidewalls 12'. Conformable layer 14' can also be replaced by a gap filled with air (n=1), which means there is a substantial gap between the rods 12/sidewalls 12' and n-type layer 22 and light-emitting region 23. The gap can be formed by removing conformable layer 14' after forming n-type layer 22, light-emitting region 23, or p-type layer 24 (if rods 12/sidewalls 12' also penetrate through p-type layer 24).

In these embodiments, bigger refractive index contrast exists between the light-emitting medium and the coating layer of the composite rods/sidewalls of the lattice structure, light is vertically confined in the light-emitting medium and is vertically guided to the emitting surfaces, avoiding the strong self-absorption due to horizontal waveguide effect. These embodiments can result in enhanced light extraction efficiency.

Figure 2B:
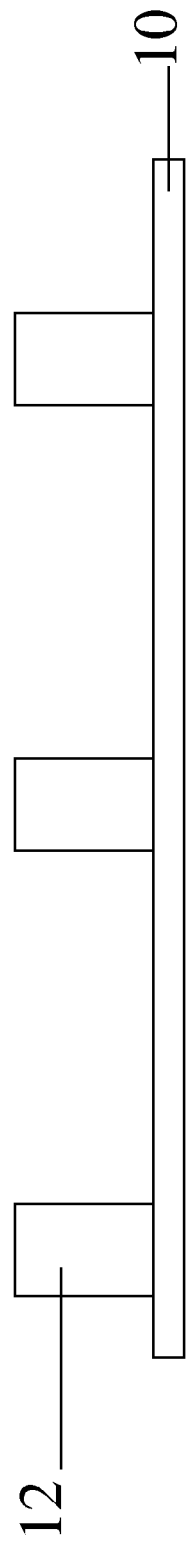
Figure 2C:
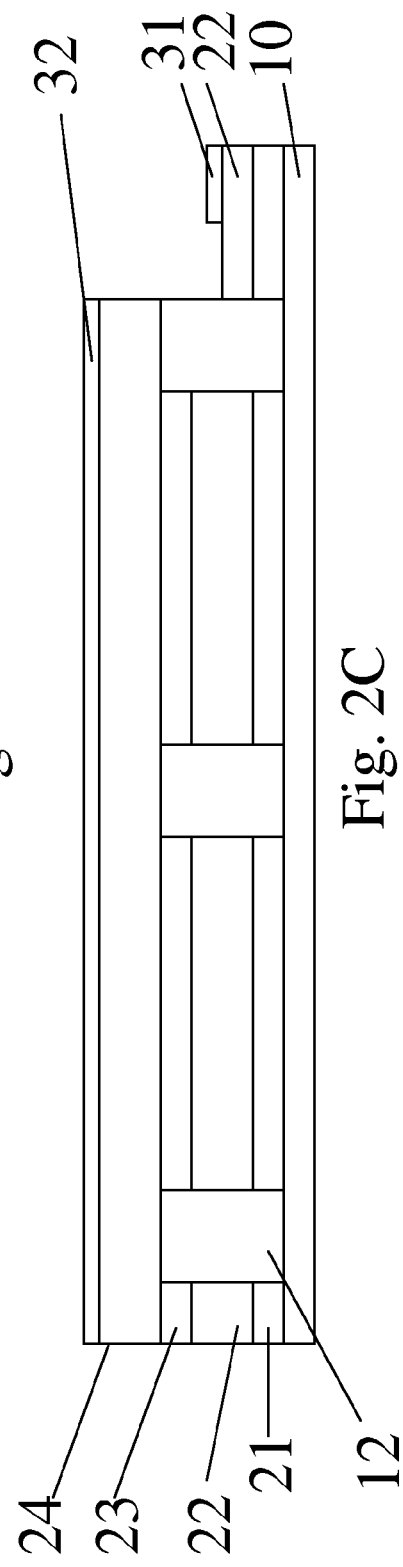

Conformable layer 14' can be similarly applied to the light emitting structure as shown in FIGS. 2A-2C.

Figure 4A:
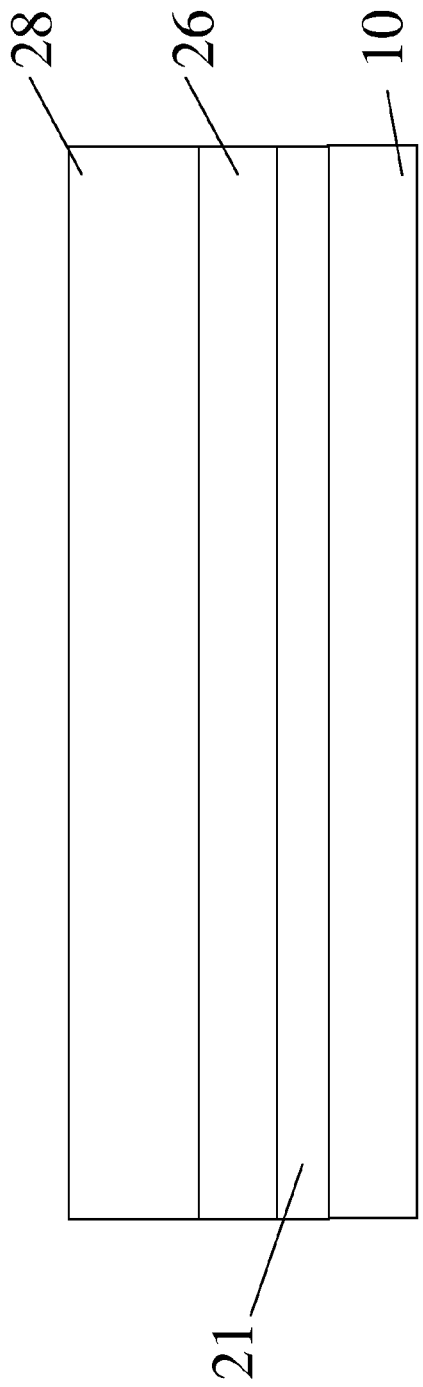
FIGS. 4A-4B illustrate steps of another method to fabricate vertical waveguide of a light-emitting device by patterning a material layer deposited on an electrically conductive layer which in turn is deposited on a substrate.
Figure 4B:
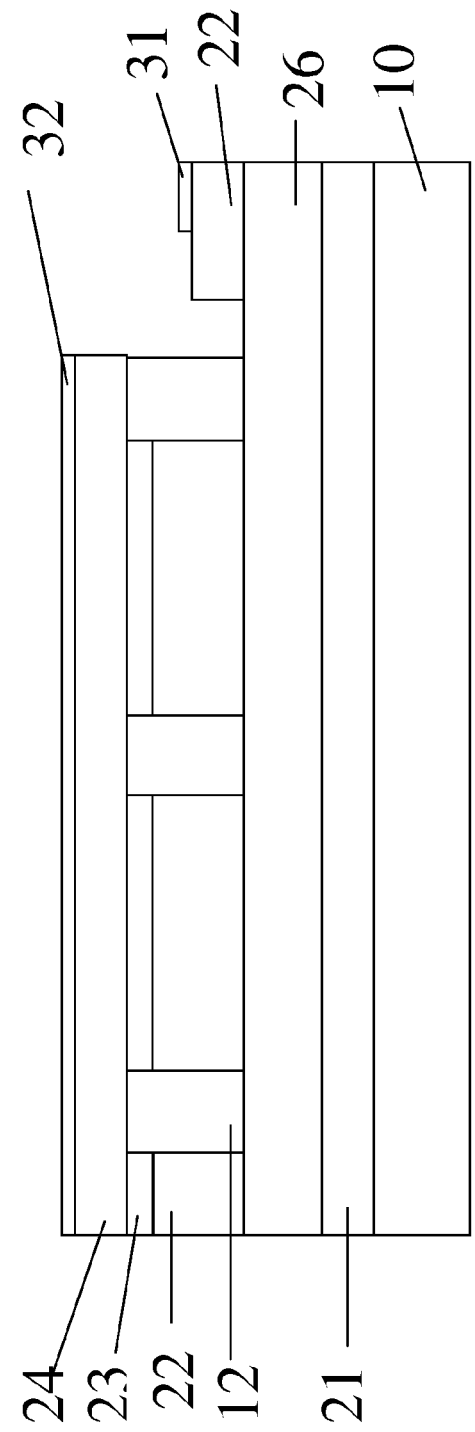

FIGS. 4A-4B present another embodiment of the present invention. Substrate 10 can be of any kind of suitable materials conventionally used in the field, such as sapphire, spinel, quartz, gallium nitride, silicon carbide, silicon, gallium arsenide, and the like. A thin buffer layer 21 similar to that as shown and discussed in FIGS. 1A-1E is firstly deposited on substrate 10 to prepare for the following epilayers' growth. Over the buffer layer 21, a thick conducting layer 26 is deposited. Conducting layer 26 provides a good electrical conduction to the layers or devices deposited thereon. Conducting layer 26 can be formed over buffer layer 21 by epitaxial growth or by other conventional method. In the nitride-based visible LED cases, conducting layer 26 is preferably Si-doped GaN, with a thickness greater than 2 µm, and a sheet resistance less than 30 Ω/cm. Conducting layer 26 can also be formed using other conductive materials such as Si-doped InGaN or AlGaN. Upon conducting layer 26 an electrically insulating layer 28 is deposited. The thickness of layer 28 is determined depending on the thickness of n-type layer 22, the light-emitting layer 23, or p-type layer 24 and some other factors. For example, the thickness of insulating layer 28 can the same as or slightly larger than the sum of the thickness of n-type layer 22 and light-emitting layer 23, or the same as or slightly larger or slightly smaller than the sum of the thickness of n-type layer 22, light-emitting layer 23 and p-type layer 24. In some embodiments, the thickness of insulating layer 28 is in the range from 0.5 to 1.0 µm. In some embodiments, the thickness of insulating layer 28 is in the range from 1.0 to 10 µm. Further, referring to FIG. 4B, insulating layer 28 is etched to form rods 12 or sidewalls 12' and, then, epitaxial growth of n-type layer 22, light-emitting layer 23, and p-type layer 24 is performed in a similar way to the steps shown in FIGS. 1A-1E, except that, now the etching depth is controlled by the interface of insulating layer 28 and conducting layer 26. Here etching is fulfilled with full electrical access to conducting layer 26 by the later formed n-type layer 22. In other words, n-type layer 22 or each area unit of n-type layer 22 defined by sidewalls 12' should be in electrical connection with conducting layer 26. In some embodiments, over-etching 0.1-0.3 µm into conducting layer 26 is conducted to make sure devices thereon have full electrical access to conducting layer 26. However, the over-etching into conducting layer 26 cannot excess the thickness of conducting layer 26. Again, rods rods 12/sidewalls 12' can be coated with a layer of material, such as silicon nitride, $TiO_2$, or other materials as discussed above. Since now the device is sitting on the thick conducting layer 26 and the n-type layer 22 is electrically connected to the conducting layer 26, the closed area units of n-type layer 22 are electrically connected to each other through conducting layer 26, those closed area units otherwise would not electrically connected to each other.

The lattice structure of rods 12/sidewalls 12' can be of any one and/or two dimensional lattice, or randomly arranged. Exemplary lattices shown in FIG. 5 to FIG. 13 and others discussed above can be applied to the embodiments illustrated in FIGS. 4A-4B.

Figure 10:
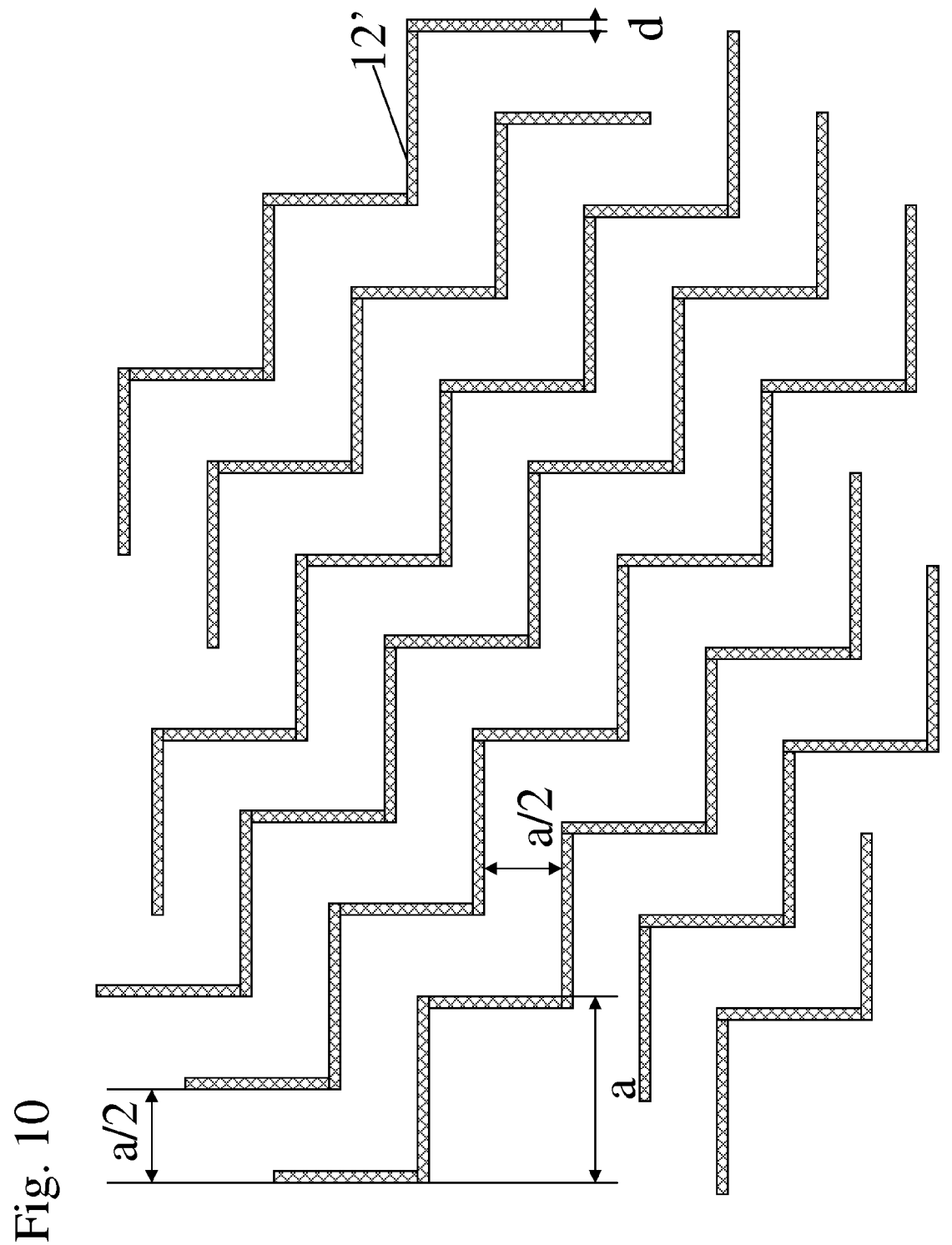
FIG. 10 is a top view of a one-dimensional lattice structure with repeating zigzag sidewalls.
Figure 11:
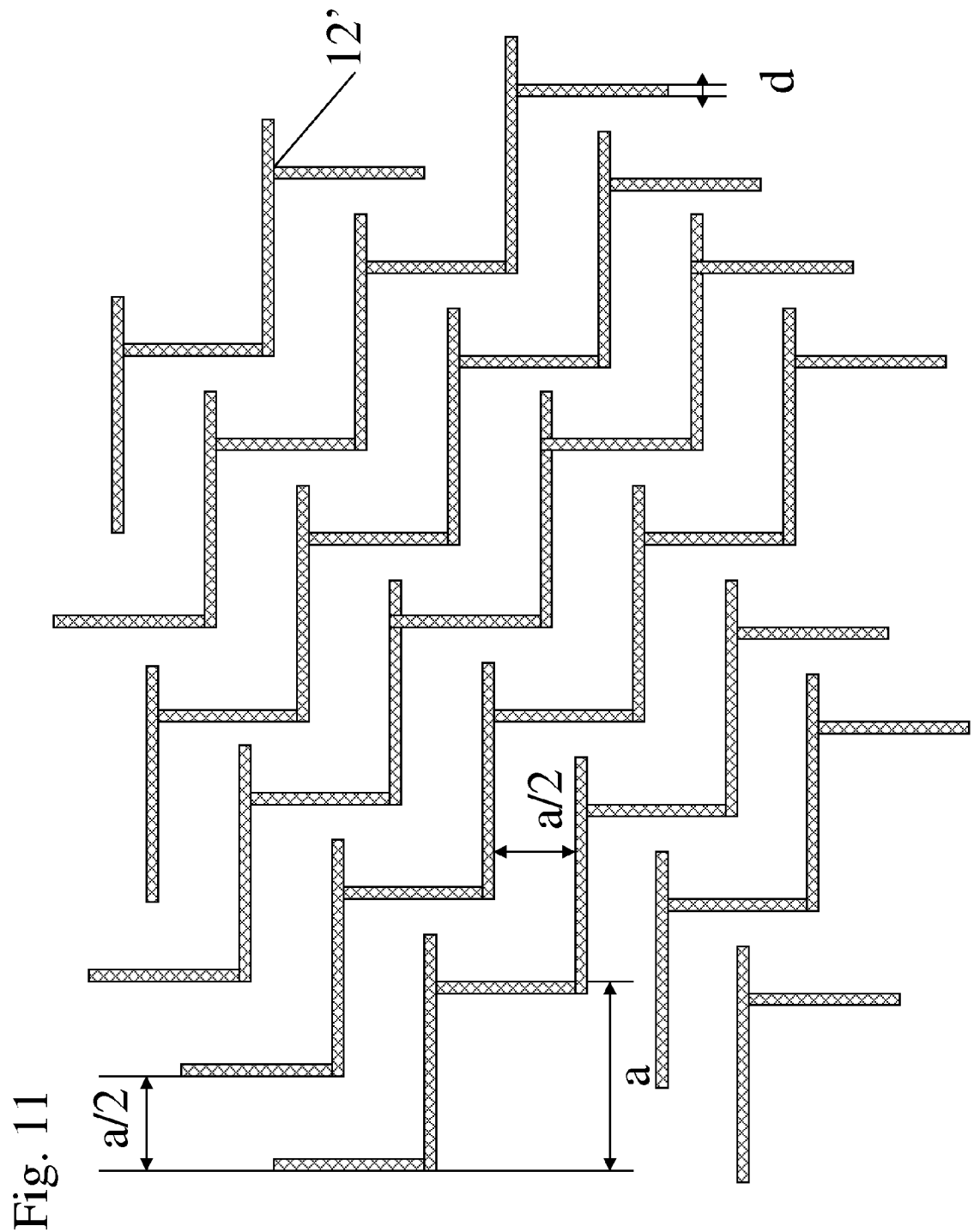
FIG. 11 is a top view of a one-dimensional lattice structure with modified repeating zigzag sidewalls.

Presented in FIG. 5 is a top view of a two-dimensional lattice structure made of sheet-shaped sidewalls 12', showing sidewalls 12' forming a solid grid which defines a plurality of closed area units 12'-*i*. It is understood from FIGS. 4A-4B and FIG. 5 that the sidewalls 12' completely encircle each closed area unit 12-*i* in the light-emitting layer 23, preventing light leaking horizontally across the light-emitting layer 23. It is believed that this will block the horizontal waveguide effect to a maximal degree and implement a preferably vertical light extraction effect. Alternatively, shown in FIG. 10-11 is a one-dimensional lattice structure. The dislocated one-dimensionally zigzagged sidewalls 12' can significantly reduce horizontal waveguide effect, and have a similar effect to enhance the vertical light extraction efficiency. The thickness, d, of the sidewalls 12' in FIG. 5 to FIG. 11 is preferably in the range of from 200 nm to 5 µm, more preferably from 500 nm to 2 µm. And the period, a, is preferably to be from 5 to 50 µm.

In addition, the present invention can be applied to devices grown on patterned, or roughened substrate, for a further enhanced vertical light extraction efficiency. This is shown as an exemplary embodiment in FIG. 14, where rods 12 or sidewalls 12' together with a patterned substrate 10' give a good light extraction effect. In the patterned substrate 10', a plurality of vertical light waveguide structures 40 are provided from the bottom side opposite to the light-emitting layer. Structure 40 can be a structure similar to that of rods 12/sidewalls 12' in terms of material, shape, and dimension, formed by etching substrate 10' and filling the etched portion with proper solid material or with air. Structure 40 can be formed by any proper conventional method such as those described in U.S. Pat. No. 7,504,669, U.S. Pat. No. 7,642,108, and U.S. Pat. No. 7,250,635, the contents of these patents are incorporated herein by reference in their entirety.

Figure 15:
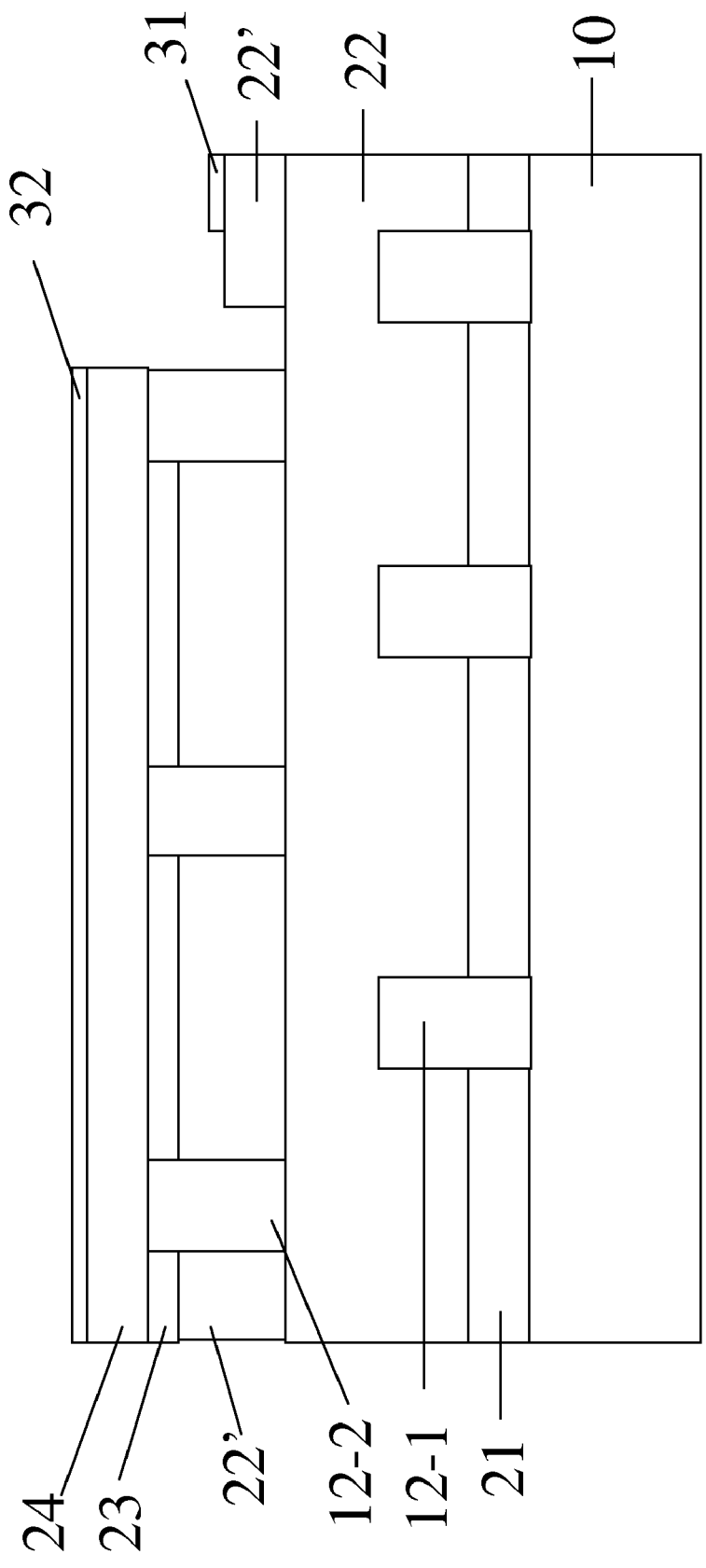
FIG. 15 illustrates the cross-sectional structure of a light emitting device with double vertical waveguide formed by two vertically arranged lattice structures.

In some embodiments, multiple sets of vertically arranged lattice structures of rods 12/sidewalls 12' are applied to enhance the vertical waveguide effect. Shown in FIG. 15 are two sets of lattice structures 12-1 and 12-2 vertically positioned relative to each other, where lattice structure 12-1 is embedded in insulating buffer layer 21 and n-type electron supplier layer 22, while lattice structure 12-2 penetrates an auxiliary n-type electron supplier layer 22' and the light emitting layer 23, and extends up to or into the p-type hole supplier layer 24. The two lattice structures can be vertically aligned or dislocated, and their lattice parameters can be the same or different. With two or more vertically arranged lattice structures, the height of rods 12 and sidewalls 12' in each lattice structure can be reduced. This makes it easier to fabricate the lattice structure, especially when the thickness of the sidewalls 12' or the rods 12 is very thin. The height of sidewalls 12' and rods 12 in each of the multiple lattice structures can be in the range 0.5 to 1.5 µm.

The light-emitting device shown in FIG. 15 can be fabricated as follows. Lattice structure 12-1 is formed on substrate 10 via any method described above in connection with FIGS. 1A-1E, 2A-2C, 3A-3F, and 4A-4B. Lattice structure 12-1 can be formed from substrate 10, or from a layer of material different than substrate 10 such as layer 11 as shown in FIG. 2A-2C and layer 28 as shown in FIG. 4A-4B. Epitaxial growth of insulating layer 21 and n-type electron supplier layer 22 is conducted until the top of lattice structure 12-1 is covered by the n-type electron supplier layer 22, Then, a layer of material such as layer 11 as shown in FIG. 2A-2C and layer 28 as shown in FIG. 4A-4B is formed on n-type electron supplier layer 22, and etched to form lattice structure 12-2 and to expose the n-type electron supplier layer 22. The auxiliary n-type electron supplier layer 22' is formed on n-type electron supplier layer 22, then light-emitting layer 23 and p-type hole supplier layer 24 are formed. Auxiliary n-type electron supplier layer 22' can be made of a material the same as or different from that of the n-type electron supplier layer 22. Transparent p-electrode 32 and n-electrode 31 are also formed accordingly. In this light-emitting device structure, the thickness of n-type electron supplier layer 22 can be in the range of 0.5 to 5 µm, the thickness of auxiliary n-type electron supplier layer 22' can be in the range of 0.5 to 2 µm. Similarly, more than two vertically arranged lattice structures can be provided to further reduce the height of rods 12 and sidewalls 12'.

Lattice structure 12-1 and lattice structure 12-2 can be inclined relative to substrate 10 at an angle as shown in FIGS. 16-18, such incline angle can be larger than 60° for convenience of fabrication.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is being claimed is:

1. A method for fabricating a light-emitting device comprising:
   patterning and etching a substrate to form a lattice structure extending upward from the substrate;
   forming a n-type layer over the substrate so that the lattice structure penetrates the n-type layer;
   forming a light-emitting layer over the n-type layer so that the lattice structure penetrates the light-emitting layer; and
   forming a p-type layer over the light-emitting layer so that the lattice structure extends up to the p-type layer or into the p-type layer.

2. The method of claim 1, further comprising forming a coating on the lattice structure before forming the n-type layer, the light-emitting layer, and the p-type layer.

3. The method of claim 2, wherein the coating is formed via epitaxial growth and etching back, or via sputtering, or via oxidation.

4. The method of claim 2 further comprising removing the coating after forming the n-type layer and the light-emitting layer, so that a gap is formed between the lattice structure and the n-type layer and the light-emitting layer.

5. The light-emitting device of claim 1, wherein the lattice structure comprises a plurality of rods which penetrate the n-type layer and the light-emitting layer, and extend up to or into the p-type layer.

6. A method for fabricating a light-emitting device comprising:
   forming a material layer over a substrate;
   patterning and etching the material layer to form a lattice structure from the material layer, wherein the lattice structure extends upward from the substrate;
   forming a n-type layer over the substrate so that the lattice structure penetrates the n-type layer;
   forming an light-emitting layer over the n-type layer so that the lattice structure penetrates the light-emitting layer; and
   forming a p-type layer over the light-emitting layer so that the lattice structure extends up to or into the p-type layer.

7. The method of claim 6, wherein the material layer comprises multiple layers of different refractive index.

8. The method of claim 6, wherein the material layer has a varying refractive index in a direction perpendicular to the substrate.

9. The method of claim 6, further comprising forming a conductive layer between the material layer and the substrate before patterning and etching the material layer, wherein the step of patterning and etching the material layer also etches into a top portion of the conductive layer.

10. A method for fabricating a light-emitting device comprising:

patterning and etching a substrate to form a first lattice structure extending upward from the substrate;

forming a first n-type layer over the substrate so that the lattice structure is embedded in the first n-type layer;

forming a material layer over the first n-type layer;

patterning and etching the material layer to form a second lattice structure from the material layer;

forming a second n-type layer over the first n-type layer so that the second lattice structure penetrates the second n-type layer;

forming a light-emitting layer over the second n-type layer so that the second lattice structure penetrates the light-emitting layer; and forming a p-type layer over the light-emitting layer so that the second lattice structure extends up to the p-type layer or into the p-type layer.

11. A method for fabricating a light-emitting device comprising:

forming a first material layer over a substrate;

patterning and etching the material layer to form a first lattice structure from the material layer, wherein the lattice structure extends upward from the substrate;

forming a first n-type layer over the substrate so that the first lattice structure is embedded in the first n-type layer;

forming a second material layer over the first n-type layer;

patterning and etching the material layer to form a second lattice structure from the material layer;

forming a second n-type layer over the first n-type layer so that the second lattice structure penetrates the second n-type layer;

forming a light-emitting layer over the second n-type layer so that the second lattice structure penetrates the light-emitting layer; and forming a p-type layer over the light-emitting layer so that the second lattice structure extends up to the p-type layer or into the p-type layer.

\* \* \* \* \*